(12) United States Patent
Lee et al.

(10) Patent No.: US 7,381,292 B2
(45) Date of Patent: Jun. 3, 2008

(54) INDUCTIVELY COUPLED PLASMA GENERATING APPARATUS INCORPORATING SERPENTINE COIL ANTENNA

(75) Inventors: Young-dong Lee, Busan (KR); Yuri Nikolaevich Tolmachev, Kyungki-do (KR); Seong-gu Kim, Kyungki-do (KR); Jai-kwang Shin, Kyungki-do (KR)

(73) Assignee: Samsung Electronics Co., Ltd., Suwon, Kyungki-Do (KR)

( * ) Notice: Subject to any disclaimer, the term of this patent is extended or adjusted under 35 U.S.C. 154(b) by 289 days.

(21) Appl. No.: 10/684,522

(22) Filed: Oct. 15, 2003

(65) Prior Publication Data

US 2004/0079485 A1 Apr. 29, 2004

(30) Foreign Application Priority Data

Oct. 15, 2002 (KR) .............. 10-2002-0062701

(51) Int. Cl.
*H01L 21/306* (2006.01)
*C23C 16/00* (2006.01)
(52) U.S. Cl. .............. 156/345.48; 118/723 I
(58) Field of Classification Search .......... 118/723 I, 118/723 IR, 723 AN; 156/345.48, 345; 315/111.51
See application file for complete search history.

(56) References Cited

U.S. PATENT DOCUMENTS

| 5,346,578 | A |   | 9/1994 | Benzing et al. |         |
|-----------|---|---|--------|----------------|---------|
| 5,401,350 | A |   | 3/1995 | Patrick et al. |         |
| 5,578,165 | A |   | 11/1996| Patrick et al. |         |
| 5,681,393 | A | * | 10/1997| Takagi         | 118/723 IR |
| 5,731,565 | A | * | 3/1998 | Gates          | 219/121.54 |
| 5,938,883 | A | * | 8/1999 | Ishii et al.   | 156/345.49 |
| 6,164,241 | A | * | 12/2000| Chen et al.    | 118/723 I |
| 6,177,646 | B1| * | 1/2001 | Okumura et al. | 219/121.43 |

(Continued)

FOREIGN PATENT DOCUMENTS

JP 08-330281 12/1996

(Continued)

OTHER PUBLICATIONS

Korean Patent Office Action and English Translation.

(Continued)

*Primary Examiner*—Luz Alejandro-Mulero
(74) *Attorney, Agent, or Firm*—Buchanan Ingersol & Rooney PC

(57) ABSTRACT

An inductively coupled plasma (ICP) generating apparatus includes an evacuated reaction chamber, an antenna installed at an upper portion of the reaction chamber to induce an electric field for ionizing reaction gas supplied into the reaction chamber and generating plasma, and an radio frequency (RF) power source connected to the antenna to apply radio frequency power to the antenna, wherein the antenna has a plurality of coils having different radiuses, at least one of the coils being a serpentine coil bent in a zigzag pattern. Capacitors are connected between the RF power source and a matching network and between the matching network and the antenna, in parallel with the antenna, to induce a LC resonance phenomenon. With the ICP generating apparatus having the above structure, it is possible to reduce antenna inductance, suppress capacitive coupling, and improve plasma uniformity. It is also possible to discharge and sustain plasma efficiently using the LC resonance phenomenon.

24 Claims, 17 Drawing Sheets

U.S. PATENT DOCUMENTS

| | | |
|---|---|---|
| 6,237,526 B1 | 5/2001 | Brcka |
| 6,244,211 B1* | 6/2001 | Nishikawa et al. ... 118/723 AN |
| 6,288,493 B1 | 9/2001 | Lee et al. |
| 6,291,793 B1 | 9/2001 | Qian et al. |
| 6,319,355 B1* | 11/2001 | Holland .................. 156/345.48 |
| 6,653,988 B2* | 11/2003 | Kwon et al. ................. 343/895 |
| 6,842,147 B2* | 1/2005 | Howald et al. ............. 343/701 |
| 2003/0010454 A1* | 1/2003 | Bailey et al. .......... 156/345.49 |
| 2003/0111181 A1* | 6/2003 | Wang et al. ........... 156/345.48 |
| 2004/0011467 A1* | 1/2004 | Hemker et al. ........ 156/345.49 |
| 2004/0124779 A1* | 7/2004 | Howald et al. ......... 315/111.51 |
| 2006/0027168 A1* | 2/2006 | Matsuda et al. .......... 118/723 I |

FOREIGN PATENT DOCUMENTS

| | | |
|---|---|---|
| JP | 10-074736 | 3/1998 |
| JP | 2001-085196 | 3/2001 |
| JP | 2001-516944 A | 12/2001 |
| JP | 2004-509429 A | 3/2004 |
| WO | WO 00/36632 | 6/2000 |

OTHER PUBLICATIONS

Chinese Patent Office Action and English Translation.

* cited by examiner

MAGNITUDE OF Br

DISTANCE FROM CENTER OF ANTENNA

MAGNITUDE OF Br

DISTANCE FROM CENTER OF ANTENNA

INDUCTIVELY COUPLED PLASMA GENERATING APPARATUS INCORPORATING SERPENTINE COIL ANTENNA

BACKGROUND OF THE INVENTION

This application claims the priority of Korean Patent Application No. 2002-62701, filed on Oct. 15, 2002, in the Korean Intellectual Property Office, the disclosure of which is incorporated herein in its entirety by reference.

1. Field of the Invention

The present invention relates to an apparatus for generating inductively coupled plasma (ICP), and more particularly, to an ICP generating apparatus incorporating an antenna with a structure that can improve uniformity of plasma.

2. Description of the Related Art

Recently, plasma technology is widely used in the manufacture of semiconductor devices and flat display panels. Plasma is used for etching or depositing certain materials on the surfaces of wafers for fabricating semiconductor devices, or substrates for fabricating liquid crystal display (LCD) panels. Particularly, in etching or thin film deposition processes for manufacturing highly integrated semiconductor devices, the use of plasma equipment is increasing. Therefore, development of plasma generating apparatuses appropriate for etching, deposition, or other processes is important for the development of semiconductor manufacturing processes and equipment. The most important factors in the development of plasma equipment for semiconductor manufacturing processes are the capability to operate on large substrates in order to enhance production yield, and capability to perform processes for fabricating highly integrated devices. Specifically, in accordance with a recent increase in wafer size from 200 mm to 300 mm, enhancing uniformity of wafer treatment processes as well as keeping high plasma density have become very important.

Various types of plasma equipment have been used in conventional semiconductor manufacturing processes, e.g., a capacitive coupled plasma (CCP) type, an electron cyclotron resonance (ECR) type, a helicon type, an inductively coupled plasma (ICP) type, and a hybrid type combining two or more of the foregoing types. Among the various types of plasma equipment, the ICP type equipment is considered to be the best equipment for the 300 mm large-size wafers because the ICP equipment can generate plasma with high density and high uniformity and has a simple structure compared to the other types of plasma equipment. However, development of ICP equipment for 300 mm wafers is not easily achieved by simply changing the dimensions of existing ICP equipment for 200 mm wafers. There are plenty of limitations due to difficulties in designing antennas that are essential to ICP discharges.

FIG. 1 shows the structure of a conventional ICP generating apparatus. As shown in FIG. 1, the ICP generating apparatus includes a reaction chamber 10 including a space for generating plasma. An electrostatic chuck 12 for supporting a substrate, e.g., a wafer W, is provided at a lower portion within the reaction chamber 10, and a dielectric window 16 is formed in an upper cover 11 of the reaction chamber 10. A gas supply port 14 for supplying reaction gas into the reaction chamber 10 is formed at a sidewall of the reaction chamber 10, and a plurality of gas distribution ports 15 connected to the gas supply port 14 are provided within the reaction chamber 10. A vacuum suction port 18 is formed at the bottom of the reaction chamber 10 and connected to a vacuum pump 19 for evacuating the inside of the reaction chamber 10. Further, a coil antenna 20 for generating plasma within the reaction chamber 10 is provided above the dielectric window 16.

The coil antenna 20 is connected with a power source (not shown) for supplying radio frequency (RF) current. As the RF current flows in the coil antenna 20, a magnetic field is produced around the coil antenna 20, and in accordance with variation of the magnetic field as a function of time, an electric field is induced within the reaction chamber 10. At the same time, the reaction gas is supplied into the reaction chamber 10 through the gas distribution ports 15, and is ionized by collisions with electrons accelerated by the induced electric field to generate plasma within the reaction chamber 10. The generated plasma chemically reacts with the surface of the wafer W so that the wafer W is subject to a desired process, e.g., etching. Meanwhile, an additional RF power source (not shown) is generally connected to the electrostatic chuck 12 for supplying a bias voltage to increase the energy of ions derived from the plasma and collided with the wafer W.

FIG. 2 shows an example of a conventional spiral coil antenna, and FIGS. 3A and 3B show electric field distribution and density of plasma generated within the reaction chamber shown in FIG. 1 by the spiral coil antenna shown in FIG. 2, respectively. As shown in FIG. 2, the spiral coil antenna 30 is typically comprised of a single spirally wound conductive coil. However, the spiral coil antenna 30 has a disadvantage in that the intensity of the electric field induced thereby is not uniform. That is, as shown in FIG. 3a, the electric field is relatively weak at the edge portion of the spiral coil antenna, and is relatively strong at the center portion thereof. Therefore, the density of the plasma generated is lowest at the edge portion of the reaction chamber.

The most densely generated plasma at the center portion of the reaction chamber is diffused toward a wafer placed near the bottom of the reaction chamber. Consequently, the density of the plasma in an area near the wafer surface where reaction between the plasma and the wafer occurs is high at the center portion of the area near the wafer surface, and is low at the edge portion of the area near the wafer surface.

Such irregular plasma density distribution causes a problem of the depth to which the wafer or substrate is etched or the thickness to which a material is deposited on the wafer or substrate being non-uniform over the surface thereof. As the diameter of the reaction chamber is increased to accommodate larger wafers, this non-uniformity problem becomes more serious. Further, in order to keep the plasma density sufficiently high within the reaction chamber, the radius of the antenna 30 and the number of turns of the coil should be increased to conform to the increased size of the ICP equipment. However, increasing the number of turns of the coil causes another problem in that the self-inductance of the antenna increases, and accordingly, the efficiency of the plasma discharges is degraded. If the self-inductance of the antenna 30 increases, the antenna 30 requires a higher voltage, and capacitive coupling easily occurs. The capacitive coupling increases the kinetic energy of ions too high, thereby making it difficult to precisely control processes. In addition, as the ions with such high kinetic energy collide very strongly against the inner wall of the reaction chamber, undesirable particles are separated from the inner wall. Further, the capacitive coupling lowers the efficiency of the plasma discharges.

FIGS. 4A and 4B show the distribution of radial direction components of magnetic fields produced by a conventional circular coil antenna. The left photograph images in FIGS.

4A and 4B show the structure of the antenna as well as the distribution of the radial direction components $B_r$ of magnetic fields produced thereby, and the right graphs show the magnitude of the radial direction components $B_r$ of the magnetic fields as function of distance from the center of the antenna. In particular, the right graphs is the results of a simulation using Vector Fields, which is electromagnetic field analysis software, on the distribution of the radial direction components $B_r$ of the magnetic fields produced 5 cm below the center of the cross-section of the antenna coil, where current distributions in coils forming the antenna are assumed to be uniform across the entire cross-section of the coils.

The antenna shown in FIG. 4A includes three concentric coils having a radius of 7 cm, 14 cm, and 21 cm, respectively. Each coil has a 6×6 mm square cross-section. Current flows in the same direction through each coil.

When current flows in the same direction through each coil, the magnitude of the magnetic fields appear to be higher near the center portion of the antenna. Plasma generated at a strong magnetic field portion diffuses over the entire the reaction chamber. In a reaction chamber with such a magnetic field distribution, plasma density decreases from the center to the edge portion.

The antenna shown in FIG. 4B has the same structure as the antenna of FIG. 4A. However, current flows in opposite directions through adjacent coils. When current flows in opposite directions through adjacent coils as in the antenna of FIG. 4B, the inductance of the antenna drops by about 50% with respect to the inductance of the antenna of FIG. 4A, as illustrated in FIG. 13. However, due to a peak magnetic field intensity near the center of the antenna of FIG. 4B, it is unlikely to attain highly uniform plasma density.

FIGS. 5A through 5D show various antennas proposed to solve the problems of the above-described coil antennas. FIG. 5A shows an antenna 40 disclosed in U.S. Pat. No. 5,346,578, which includes a domed upper cover 44 for a reaction chamber 42, and a spiral coil wound around the upper cover 44 in dome shape. Advantageously, the geometry of the antenna 40 offers highly uniform plasma density.

However, it is difficult to manufacture such a domed upper cover 44, and the domed upper cover 44 is likely to suffer from stress to thermal expansion due to the antenna 40. In addition, because the coil is long enough to spirally wind the upper cover 44, from the upper portion to the lower portion, the inductance of the antenna 40 is increased. Accordingly, lower RF frequencies are required. For larger equipment manufactured to accommodate 300-mm wafers, the number of turns of the coil and the diameter of the antenna 40 increase. As a result, the above-described problems become more serious.

FIG. 5B shows an antenna 50 disclosed in U.S. Pat. No. 5,401,350, which includes a spiral coil antenna 50a formed on a top surface of a reaction chamber 52 and a solenoid type antenna 50b wound around an outer sidewall of the reaction chamber 52. The antenna 50 of FIG. 5B can compensate for the problem of low plasma density at the edge portion of a reaction chamber with the conventional spiral coil antenna described above. However, the antenna of FIG. 5B still has other problems with the conventional spiral coil antenna. Further, since the antenna of FIG. 5B requires two independent RF power sources, there are many process parameters to externally control. In practice, ICP generating apparatuses with the antenna of FIG. 5A or 5B utilizes considerably lower frequencies than a standard frequency of 13.56 MHz.

FIG. 5C shows an antenna 60 disclosed in U.S. Pat. No. 6,291,793, which includes a plurality of spiral coils 62, 64, and 66 branching off in parallel. The multiple and parallel type antenna shown in FIG. 5c is advantageous in that the self-inductance of the antenna 60 can be lowered as the number of branching off coils 62, 64, and 66 increases. However, such a multiple and parallel type antenna has no distinctive feature ensuring satisfactorily uniform plasma density distribution.

FIG. 5D shows an antenna 70 disclosed in U.S. Pat. No. 6,288,493, which includes a plurality of circular coils 71, 72, 73, and 74 branching off in parallel and a variable capacitor 76 connected to the plurality of circular coils to induce LC resonance between the circular coils 71, 72, 73, and 74. The antenna shown in FIG. 5D is advantageous in that highly uniform plasma density distribution can be achieved because the magnitude and phase of current are adjustable and that the inductance of the antenna is low due to the parallel structure. The antenna of FIG. 5D is regarded as the most advanced one among circular coil type antennas developed so far. However, if a LC resonance occurs between the parallel branching off antenna coils 71, 72, 73, and 74, an excess amount of current flows along the outermost coil 74 and arcing occurs at a point 75 from which the outermost coil 74 branches off.

Due to the problems described above, the conventional antennas disclosed so far have shortcomings in adequately conforming to variations in process conditions to obtain high plasma uniformity. Particularly, as wafers become larger, it is more difficult to maintain uniform plasma density near the edge portions of the wafers using the conventional antennas, and as a result, the quality and yield of semiconductor devices are seriously deteriorated.

SUMMARY OF THE INVENTION

The present invention provides an inductively coupled plasma (ICP) generating apparatus incorporating a serpentine coil antenna having a structure that can improve uniformity of plasma density, reduce inductance, and suppress capacitive coupling.

The present invention also provides an ICP generating apparatus incorporating an antenna having a structure that ensures easy initial plasma discharge based on a LC resonance phenomenon and high plasma uniformity.

In accordance with one aspect of the present invention, there is provided an ICP generating apparatus comprising: an evacuated reaction chamber; an antenna installed at an upper portion of the reaction chamber to induce an electric field for ionizing reaction gas supplied into the reaction chamber and generating plasma; and an radio frequency (RF) power source connected to the antenna to apply radio frequency power to the antenna, wherein the antenna comprises a plurality of coils having different radiuses, at least one of the coils being a serpentine coil bent in a zigzag pattern.

According to specific embodiments of the ICP generating apparatus, the antenna may comprise a circular coil arranged at a center portion of the antenna and a serpentine coil arranged around and connected to the circular coil. Alternatively, the antenna may comprise a first circular coil arranged at a center portion of the antenna, a serpentine coil arranged around and connected to the first circular coil, and a second circular coil arranged around and connected to the serpentine coil. Alternatively, the antenna may comprise a circular coil arranged at a center portion of the antenna, a first serpentine coil arranged around and connected to the circular coil, and a second serpentine coil arranged around and connected to the first serpentine coil. In the above embodiments, the circular coil may have a relatively small radius to reduce the area of opposing portions between the circular coil and the serpentine coil.

The serpentine coil may have a zigzag pattern with equally spaced several sections. In this case, the serpentine coil may have a plurality of outer portions extending along the perimeter thereof and a plurality of inner portions bent toward the center portion. The inner and outer portions of the serpentine coil may be arranged to correspond to center and edge portions of the reaction chamber, respectively, so that the magnitude of a magnetic field component gradually increases near the inner portions and dramatically decreases near the outer portions.

The plurality of coils may be connected by connection coils, in which the connection coils are placed high above a plane where the plurality of coils are arranged, in order to minimize their effects.

Each of the coils may have a rectangular cross-section having a width smaller than height to reduce the capacitive coupling with plasma. Alternatively, each of the coils has a circular cross-section so as to prevent an increase in resistance due to irregular current distribution over the surfaces of the coils. This circular cross-section is advantageous also when forming a coolant passage in the coils so as to allow for smooth flow of a coolant.

In another embodiment according to the present invention, the inductively coupled plasma generating apparatus may further comprises a plurality of permanent magnets arranged around the outer wall of the reaction chamber. The plurality of permanent magnets may be arranged at a region where the magnitude of a magnetic field generated by the antenna is relatively weak. Alternatively, for convenient and optimal installation, the plurality of permanent magnets may be arranged such that they can revolve simultaneously about a central axis of the reaction chamber to shift their positions according to the distribution of the magnetic field generated by the antenna.

An ICP generating apparatus having one of the above-described structures can improve uniformity of plasma density, reduce inductance, and suppress capacitive coupling.

In another aspect of the present invention, there is provided an ICP generating apparatus comprising: an evacuated reaction chamber; an antenna installed at an upper portion of the reaction chamber to induce an electric field for ionizing reaction gas supplied into the reaction chamber and generating plasma; an radio frequency (RF) power source connected to the antenna to apply radio frequency power to the antenna; a matching network connected between the radio frequency power source and the antenna; and a capacitor connected between the matching network and the antenna, in parallel with the antenna. Alternatively, the plurality of coils of the antenna may be connected in series to the radio frequency power source. At least one of the coils of the antenna may be connected in parallel to the radio frequency power source.

According to the structures of the ICP generating apparatuses described above, it is possible to discharge and sustain plasma efficiently using LC resonance phenomenon.

BRIEF DESCRIPTION OF THE DRAWINGS

The above object and advantages of the present invention will become more apparent by describing preferred embodiments thereof with reference to the attached drawings in which.

DETAILED DESCRIPTION OF THE INVENTION

Exemplary embodiments of an inductively coupled plasma (ICP) generating apparatus according to the present invention will be described below with reference to FIGS. 6 through 17.

Figure 6:
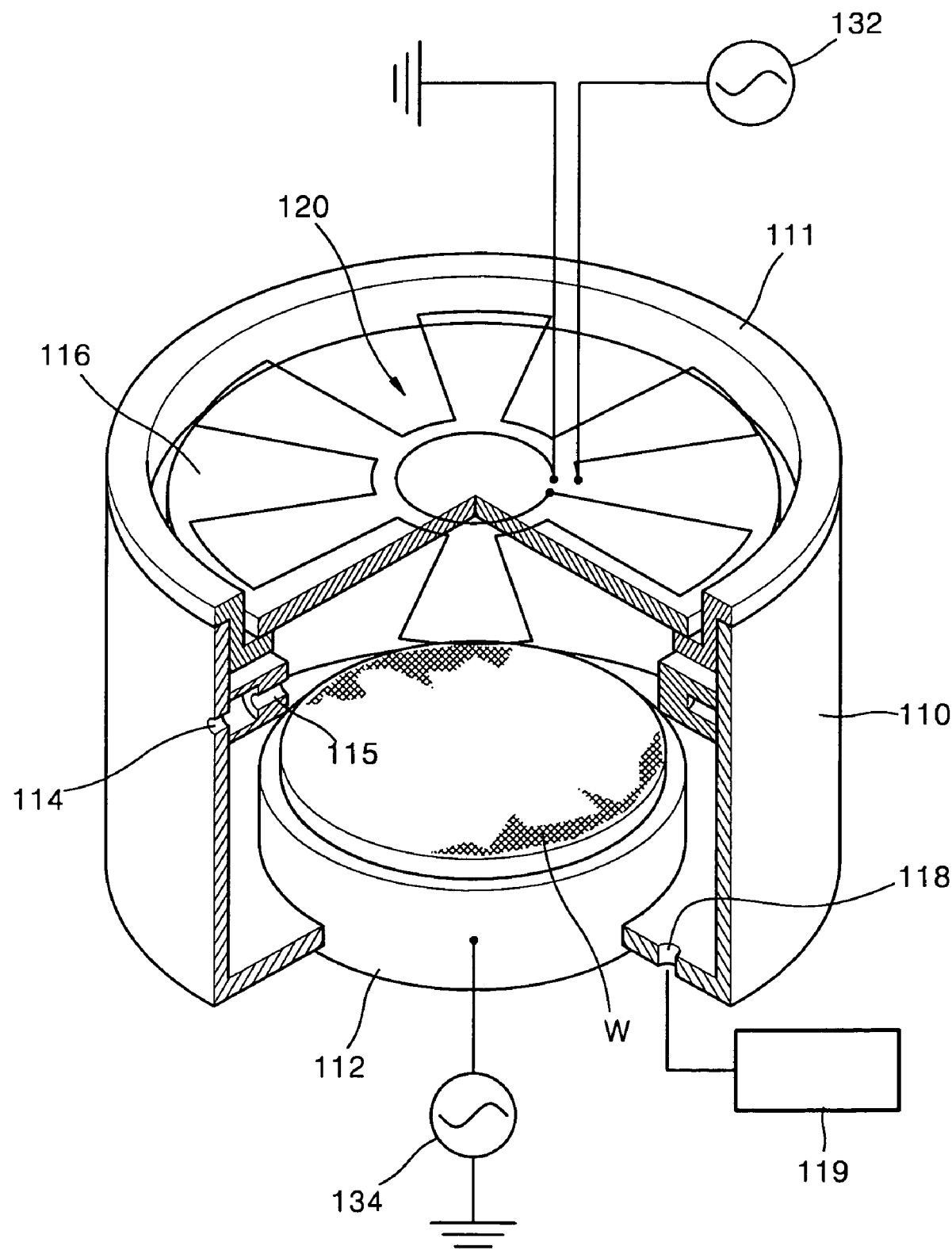
FIG. 6 is an exploded perspective view of an ICP generating apparatus incorporating a serpentine coil antenna according to a first embodiment of the present invention.
Figure 7:
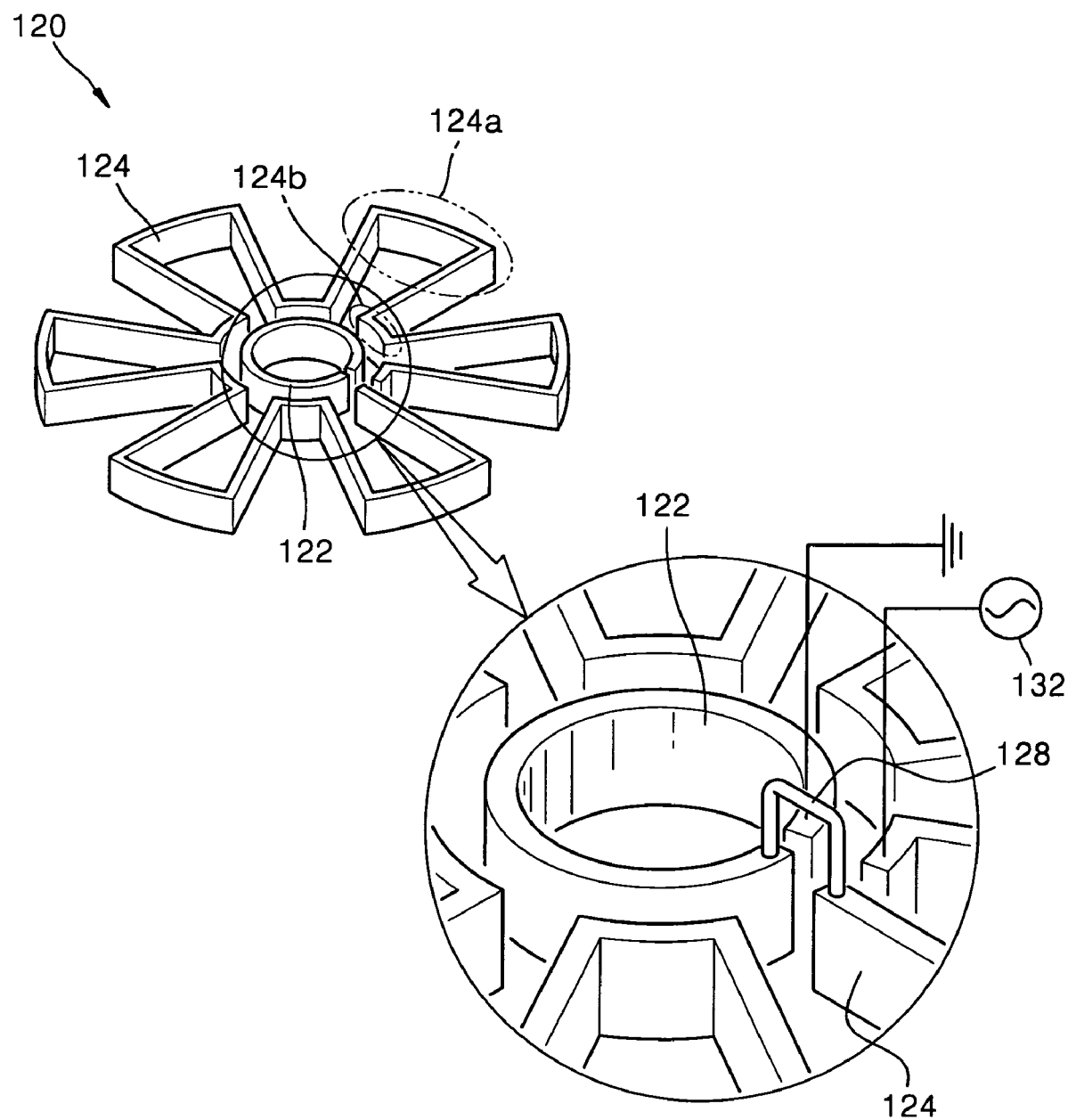
FIG. 7 is an enlarged perspective view of the serpentine coil antenna of FIG. 6.

FIG. 6 is an exploded perspective view of an ICP generating apparatus incorporating a serpentine coil according to a first embodiment of the present invention, and FIG. 7 is an enlarged perspective view of the serpentine coil antenna in FIG. 6. The ICP generating apparatus of FIG. 6 is a semiconductor manufacturing apparatus for finely processing a substrate, i.e., a wafer W, e.g., etching or depositing a certain material on the wafer W using plasma being generated by an antenna 120.

Referring to FIG. 6, the ICP generating apparatus includes a reaction chamber 110 including a space for generating plasma. The inside of the reaction chamber 110 is kept in a vacuum state, and for that purpose, a vacuum suction port 118 is provided at the bottom of the reaction chamber 110 and connected to a vacuum pump 119. An electrostatic chuck 112 for supporting a substrate, e.g., a wafer W, is provided at a lower portion within the reaction chamber 110, and an RF power source 134 is connected to the electrostatic chuck 112 to apply a bias voltage to enable ions of the plasma generated within the reaction chamber 110 to collide against the surface of the wafer W with sufficiently high energy. A dielectric window 116 is installed at the upper cover 111 of the reaction chamber 110 to transmit the RF power. A gas supply port 114 is formed at the sidewall of the reaction chamber 110 to supply reaction gas into the reaction chamber 110. A plurality of gas distribution ports 115 connected to the gas supply port 114 may be provided within the reaction chamber 110.

The antenna 120 is provided on the top of the reaction chamber 110, i.e., above the dielectric window 116 to induce an electric field in order to generate plasma by ionizing reaction gas supplied into the reaction chamber 110. An RF power source 132 is connected to the antenna 120 to supply RF power thereto. As RF currents flow in coils forming the antenna 120, a magnetic field is produced according to Ampere's right-hand rule. As the magnetic field varies as a function of time, an electric field is induced within the reaction chamber 120 according to Faraday's law of electromagnetic induction. The induced electric field accelerates electrons, and the accelerated electrons ionize reaction gas supplied into the reaction chamber 120 through the gas distribution ports 115 to generate plasma.

The antenna 120 includes, as shown in FIG. 7, a circular coil 122 placed at a center portion and a serpentine coil 124 around the circular coil 122. The serpentine coil 124 has a zigzag pattern with equally spaced sections along the perimeter of the antenna 120. The number of zigzag patterns may vary depending on the radius of the antenna 120. Although six zigzag patterns appear in FIG. 7, eight or more zigzag patterns may appear for larger radius antennas, and less than six for smaller radius antennas. In addition, the serpentine coil 124 includes a plurality of outer portions 124a extending along the circumference and a plurality of inner portions 124b bent toward the circular coil 122 placed at the center portion. The inner portions 124b are placed adjacent to the circular coil 122 to gradually increase the magnitude of a magnetic field component. Meanwhile, the magnitude of a magnetic field component produced at the outer portions 124a of the serpentine coil 124 dramatically decreases outward. The outer portions 124A are aligned with the edge portion of the wafer W in the reaction chamber 110. The area of the serpentine coil 124 is smaller than that of conventional circular coils at a given coil length, so that the inductance of the antenna 120 with the serpentine coil 124 is lower compared to conventional circular coils.

Although the corners of the serpentine coil 124 appear sharp in FIGS. 6 and 7, the corners of the serpentine coil 124 may be rounded for the convenience of fabrication. This optional design of the serpentine coil 124 is applicable throughout the embodiments described below.

The radius of the circular coil 122 and the inner and outer radiuses of the serpentine coil 124 can be adequately adjusted according to the size of the reaction chamber 110. Especially, in order to reduce capacitive coupling effects, it is preferable to reduce the radius of the circular coil 122 and the inner radius of the serpentine coil 124 to be as small as possible. This is because the smaller area of the inner portions 124b of the serpentine coil 124, which are adjacent to the circular coil 122, contributes to reducing the capacitance of the antenna 120. However, if the radius of the circular coil 122 and the inner radius of the serpentine coil 124 is too small, it is difficult to fabricate a structure with a coolant passage in the circular coil 122 and the serpentine coil 124, which is described later, and the electrical resistance increases. Therefore, the radius of the circular coil 122 and the inner radius of the serpentine coil 124 should be determined in consideration of such anticipated problems.

When forming a coolant passage (not shown) in the coils 122 and 124, the coils 122 and 124 may have a circular cross-section to allow for smooth flow of a coolant through the coolant passage. The circular cross-section of the coils 122 and 124 advantageously prevents an increase in resistance due to irregular current distribution over the surfaces of the coils 122 and 124.

In the serpentine coil antenna 120 having the structure described above, magnetic field distribution in the reaction chamber 110 can be adjusted by optimizing the radius of the circular coil 122, the difference between the inner radius and the outer radius of the serpentine coil 124, and the number of zigzag patterns. The magnetic field distribution directly affects uniformity of density of plasma generated in the reaction chamber 110. Therefore, plasma density distribution uniformity can be improved by appropriately adjusting magnetic field distribution. This will be described later.

An end of the circular coil 122 is grounded, and an end of the serpentine coil 124 is connected to the RF power source 132. Alternatively, an end of the circular coil 122 may be connected to the RF power source 132, and an end of the serpentine coil 124 may be grounded. The other ends of the circular coil 122 and the serpentine coil 124 are connected to a connection coil 128. The connection coil 128 is placed high above than the plane where the circular coil 122 and the serpentine coil 124 are placed. As a result, effects of the connection coil 128 on plasma generation are negligible.

It is preferable that the circular coil 122 and the serpentine coil 124 have a consistent rectangular cross-section having a width smaller than height. The inductance of the antenna 120 can be reduced with such narrow coils 122 and 124. This will now be described in detail with reference to FIG. 8.

Figure 8:
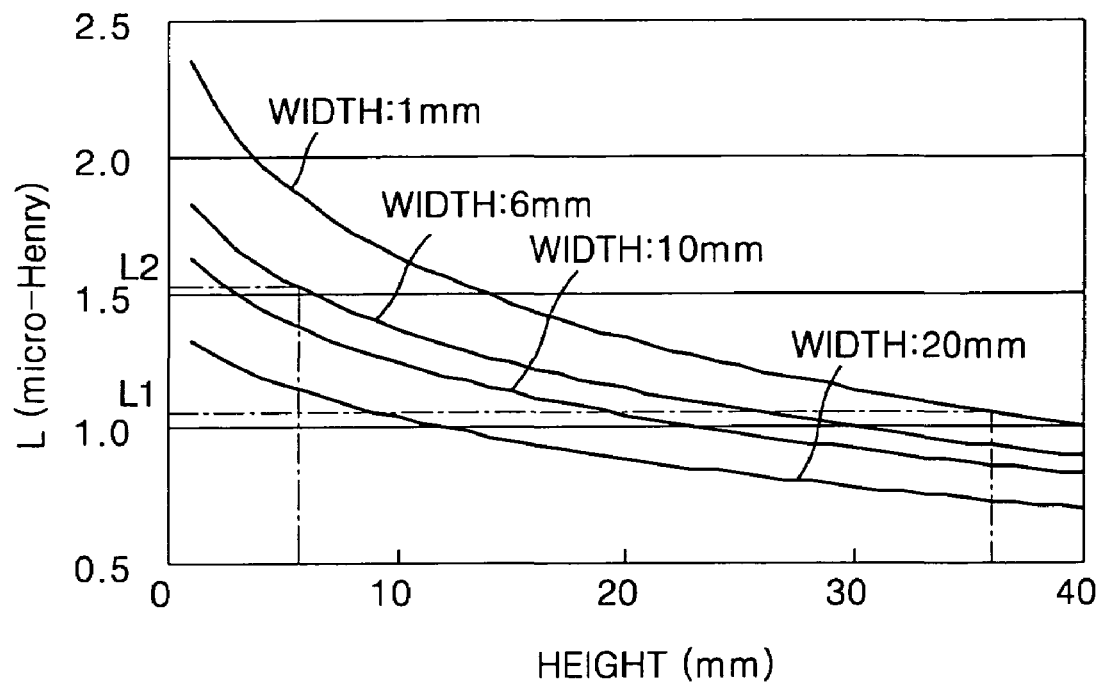
FIG. 8 is a graph of inductance versus coil height for coils having different cross-sectional shapes.

FIG. 8 is a graph of inductance (L) versus height for coils having different cross-sectional widths. Antennas, each of which consists of three circular coils having a radius of 7 cm, 14 cm, and 21 cm, respectively, were used to calculate the inductance (L), and the width and height of a cross-section of each coil were varied. It was assumed that constant current flows over the surface of each of the coils.

As is apparent from FIG. 8, the inductance of the antenna is lowered when the cross-sectional area of the coils is increased with greater width or height of the cross-section. In addition, for a given cross-sectional area, the inductance is smaller for coils with narrower widths and greater heights than for coils with greater widths and smaller heights. For two coils having the same cross-sectional area at 36 mm$^2$, the inductance $L_1$ of a coil with a cross-section having a 1-mm width and a 36-mm height is lower than the inductance $L_2$ of the other coil with a cross-section having a 6-mm width and a 6-mm height.

Referring back to FIG. 7, the circular coil 122 and the serpentine coil 124 are wound in opposite directions. Therefore, current flows through the circular coil 122 and the serpentine coil 124 in opposite directions, so that the inductance of the antenna 120 is advantageously lowered. This will be described below with reference to FIG. 9. However, the circular coil 122 and the serpentine coil 124 may be wound in the same direction if necessary.

Figure 9:
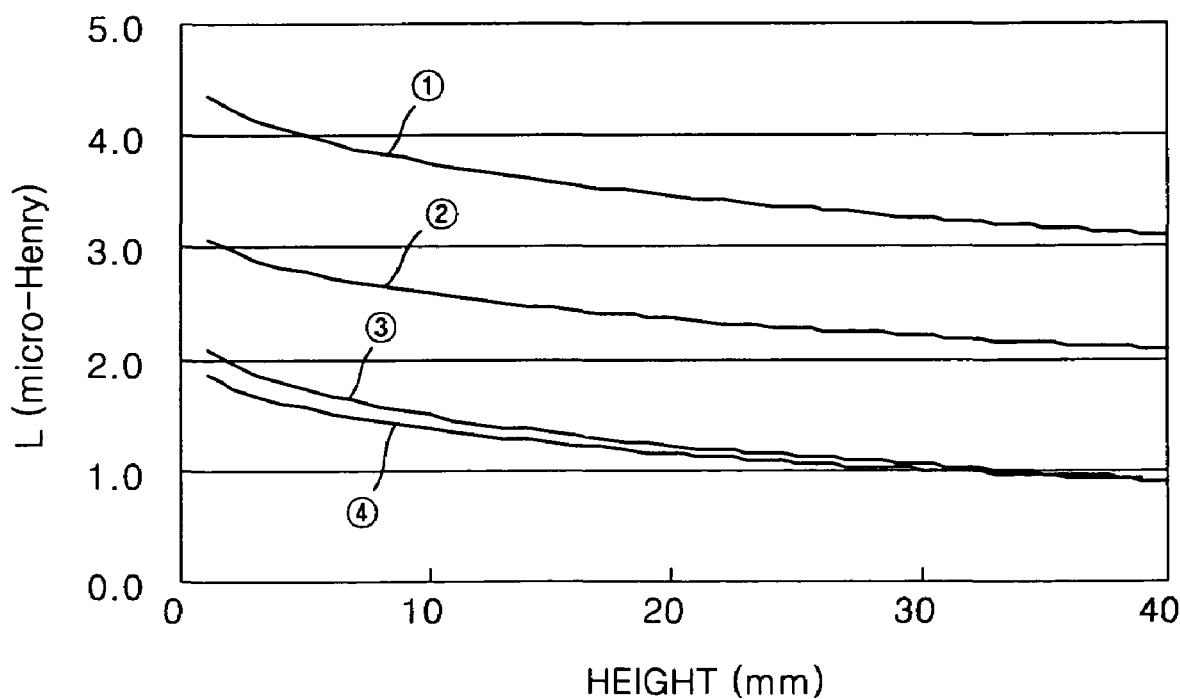
FIG. 9 is a graph showing variation in inductance of the antenna with respect to number of coils, cross-sectional shape of the coils, and the direction in which current flows through the coils.

FIG. 9 is a graph showing variation in antenna inductance L with respect to number of coils, shape of the coils, and the direction in which currents flow through the coils. In FIG. 9, graph ① indicates the calculated inductance of an antenna comprised of four circular coils having a radius of 5.25 cm, 10.5 cm, 15.75 cm, and 21 cm, respectively, when current flows in the same direction through all of the coils; graph ② indicates the calculated inductance of an antenna comprised of three circular coils having a radius of 7 cm, 14 cm, and 21 cm, respectively, when current flows in the same direction through all of the coils; graph ③ indicates the calculated inductance of the same antenna as for graph ① when current flows in opposite directions through adjacent coils; and graph ④ indicates the calculated inductance of the same antenna as for graph ② when current flows in opposite directions through adjacent coils.

As is apparent from FIG. 9, for the antennas with fewer coils (graphs ② and ④), the inductance is lower when current flows in opposite directions through adjacent coils of the antenna. The direction in which current flows through the coils of the antennas seems to have a larger affect on inductance than the number of coils. In other words, when current is allowed to flow in opposite directions through adjacent coils, the inductance of the antenna can be considerably lowered, even with more coils.

As described in the above embodiment, it is possible to effectively reduce the inductance of an antenna by varying the shape of cross-section of coils constituting the antenna and the direction of current flowing through the coils. Accordingly, higher frequency RF power can be applied to the antenna.

Figure 10:
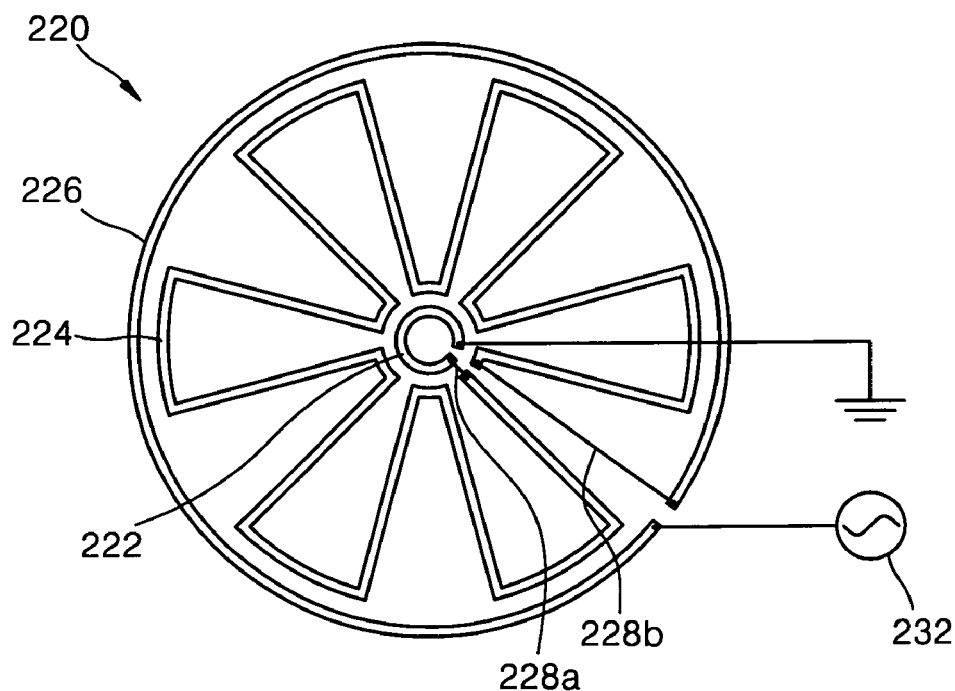
FIG. 10 is a plan view of a serpentine coil antenna incorporated in an ICP generating apparatus according to a second embodiment of the present invention.

FIG. 10 is a plan view of a serpentine coil antenna in an ICP generating apparatus according to a second embodiment of the present invention. The antenna 220 of FIG. 10 includes a first circular coil 222 placed at a center portion of the antenna 220, a serpentine coil 224 placed around the first circular coil 222, and a second circular coil 226 placed around the serpentine coil 224. That is, the antenna 220 of FIG. 10 has a structure further including additional circular coil 226 at the outermost portion compared to the antenna 120 of FIG. 7. The shape, function, and effects of the serpentine coil 224 are the same as those of the serpentine coil 124 of FIG. 7, and thus descriptions thereon will not be repeated here. The second circular coil 226 is placed very close to the perimeter of the serpentine coil 224, for example, with a separation gap of approximately 1 cm. The antenna 220 of FIG. 10 has an advantage in that the density of plasma generated near the edge of the antenna 220 is higher compared to the antenna 120 shown in FIG. 7, due to the presence of the outermost second circular coil 226. Furthermore, peak magnetic fields may be shifted in the radial direction of the antenna 220 toward the outer perimeter. This will be described later.

An end of the first circular coil 222 is grounded, and an end of the second circular coil 226 is connected to an RF power source 232. The other ends of the first circular coil 222 and the second circular coil 226 are connected to ends of the serpentine coil 224 by connection coils 228a and 228b, respectively. The connection coils 228a and 228b are placed sufficiently high above a plane where the first and second circular coils 222 and 226 and the serpentine coil 124 are placed, for minimal effect on plasma generation.

The first circular coil 222, the serpentine coil 224, and the second circular coil 226 may have rectangular cross-sections having a greater height than width. Alternatively, the first circular coil 222, the serpentine coil 224, and the second circular coil 226 may have circular cross-sections if necessary. In addition, adjacent coils are wound in opposite directions to allow for current to flow in opposite directions through the same. Advantageously, the antenna 220 having the structure shown in FIG. 10 has lower inductance, as described with reference to the antenna 120 of FIG. 7.

Figure 11:
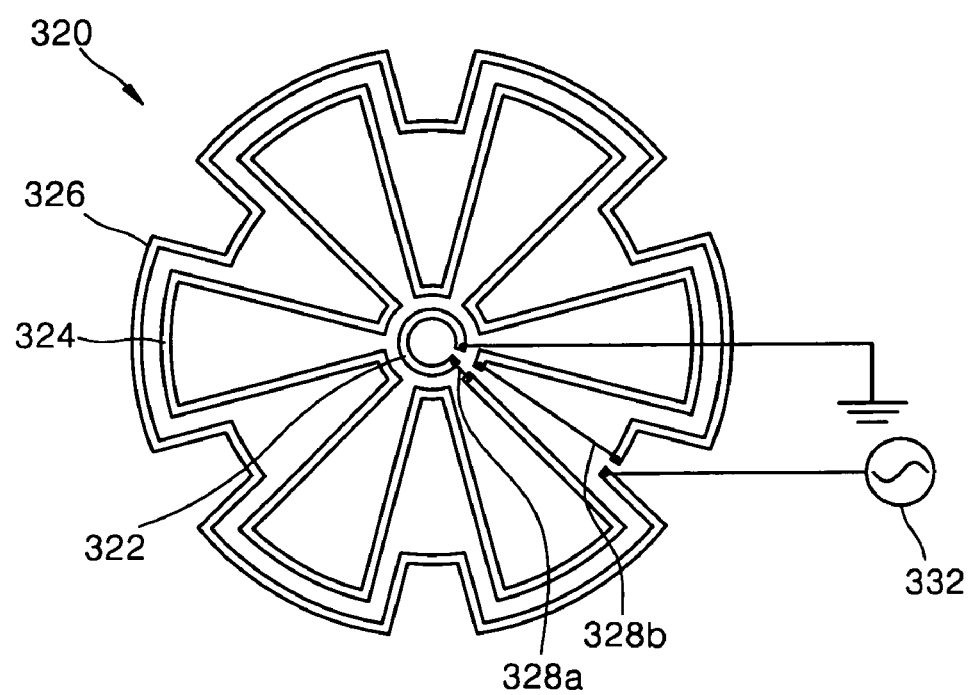
FIG. 11 is a plane view of a serpentine coil antenna incorporated in an ICP generating apparatus according to a third embodiment of the present invention.

FIG. 11 is a plan view of a serpentine coil antenna in an ICP generating apparatus according to a third embodiment of the present invention. The antenna 320 of FIG. 11 includes a circular coil 322 placed at a center portion of the antenna 320, a first serpentine coil 324 placed around the circular coil 322, and a second serpentine coil 326 placed around the first serpentine coil 324. That is, the antenna 320 of FIG. 11 has a structure of further including the additional serpentine coil 326 at the outermost portion compared to the antenna 120 of FIG. 7. In other words, the structure of the antenna 320 of FIG. 11 can be achieved by replacing the outermost second circular coil 226 of the antenna 220 of FIG. 10 with the second serpentine coil 326. The first serpentine coil 324 is the same as the serpentine coil 124 of the antenna 120 of FIG. 7. The outer perimeter of the second serpentine coil 326 is bent in a zigzag pattern, like the first serpentine coil 324, and has as many zigzags as the first serpentine coil 324 and the same interval between each zigzag. Further, the radius of an inner (groove) portion of the second serpentine coil 326 (hereinafter, inner radius) may be smaller than the radius of an outer (ridge) portion of the first serpentine coil 324 (hereinafter, outer radius). That is, the inner portion of the second serpentine coil 326 may be indented with respect to the outer portion of the first serpentine coil 324.

In the antenna 320 with such a structure, magnetic field distribution at the edge portion of the reaction chamber can be easily controlled by the second serpentine coil 326. That is, uniformity of plasma density in the reaction chamber can be optimized by appropriately designing the outermost second serpentine coil 326 in a zigzag pattern.

Figure 12A:
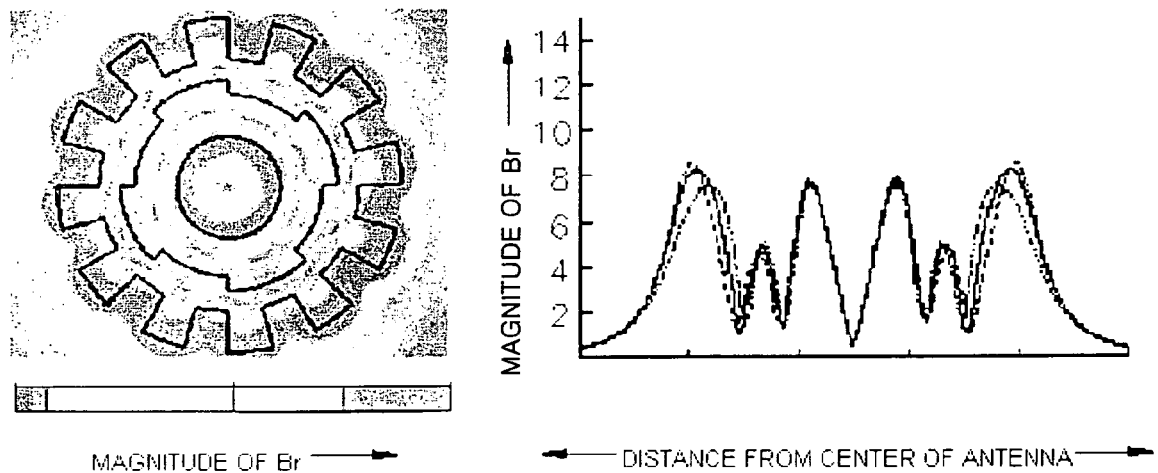
FIGS. 12A through 12G show various examples of serpentine coil antennas, and the distribution of radial magnetic field components produced by the respective antennas.
Figure 12B:
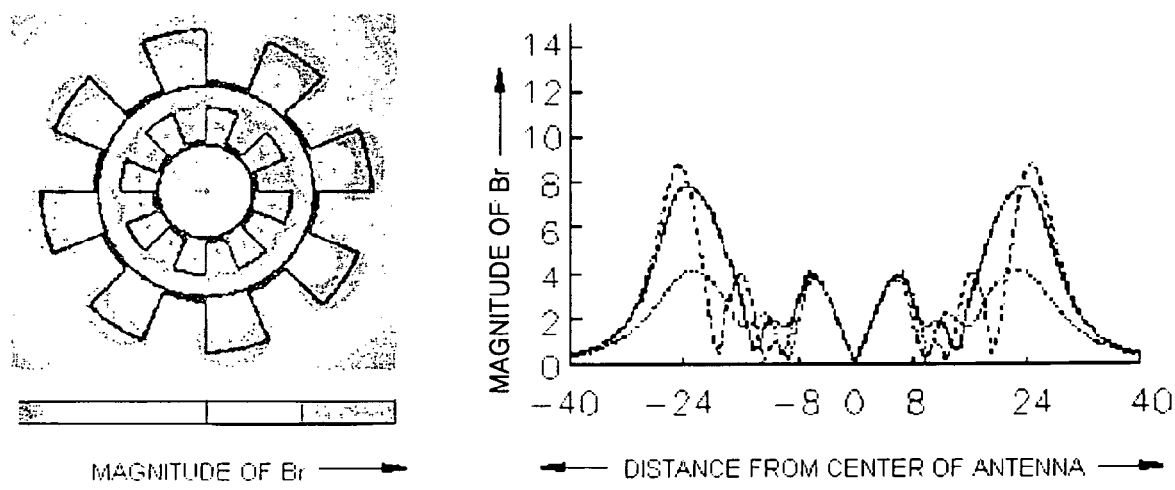
Figure 12C:
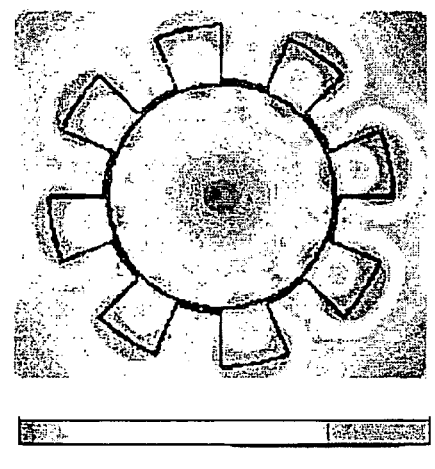
Figure 12C:
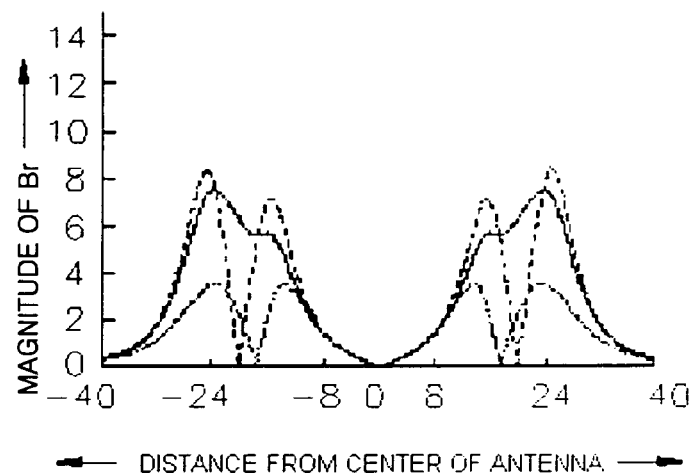
Figure 12D:
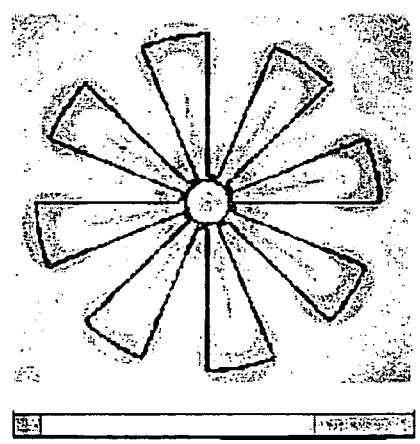
Figure 12D:
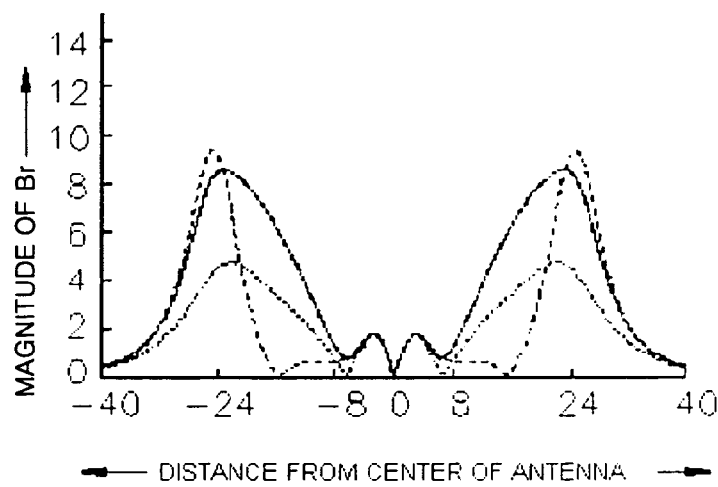
Figure 12E:
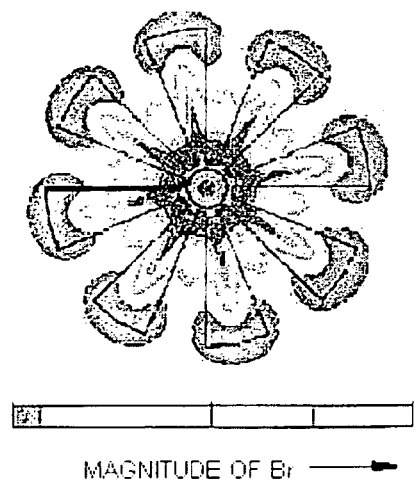
Figure 12E:
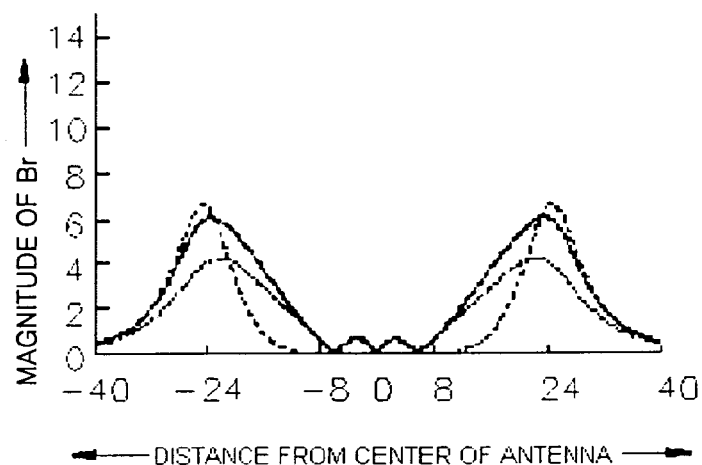
Figure 12F:
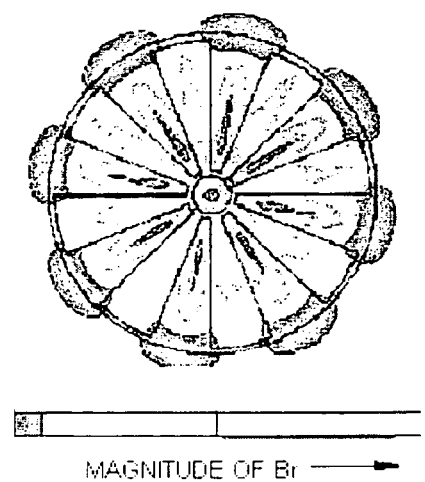
Figure 12F:
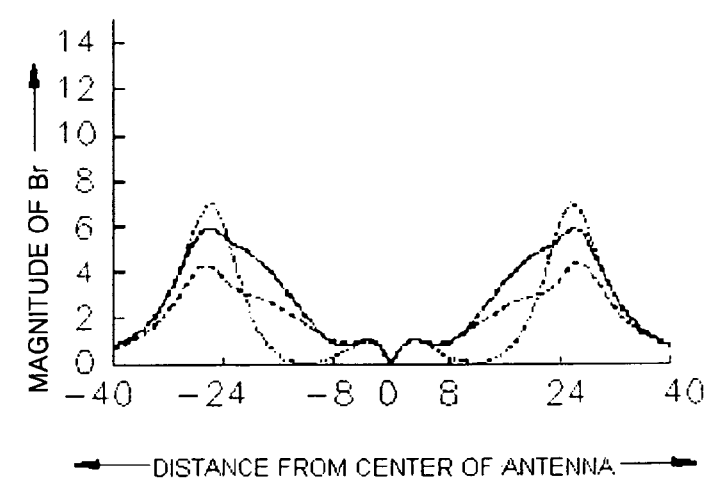
Figure 12G:
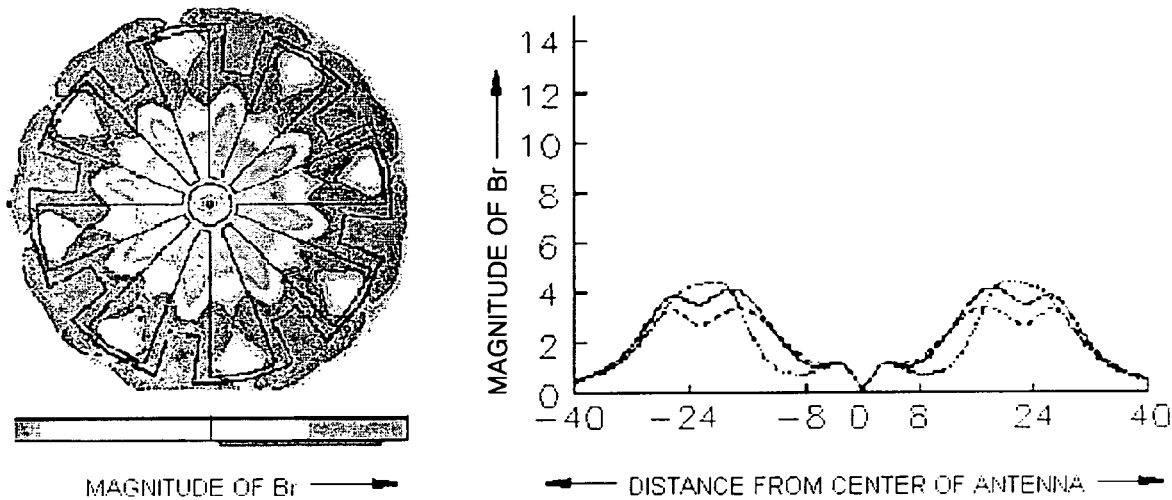
Figure 13:
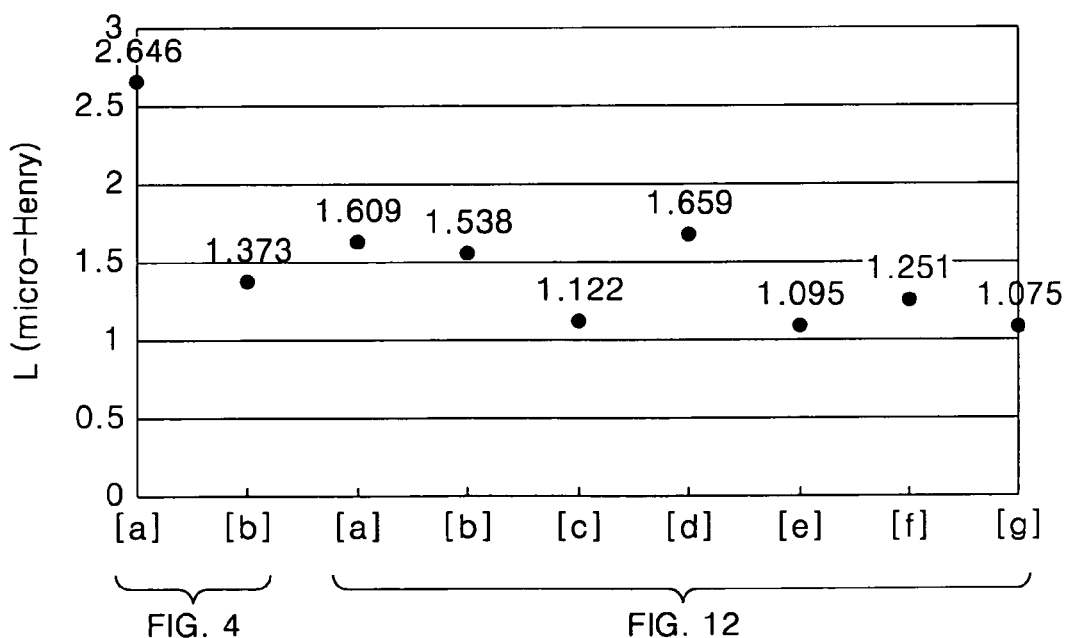
FIG. 13 is a graph of calculated inductance for the circular coil antennas of FIGS. 4A and 4B and the serpentine coil antennas of FIGS. 12A through 12G.

When an antenna has an additional outermost serpentine coil in an appropriate zigzag pattern, like a three-turn coil antenna of FIG. 12G with one more turn, the inductance of the antenna is lower compared to a two-turn coil antenna of FIG. 12E without an outermost serpentine coil, as illustrated in FIG. 13.

Referring back to FIG. 11, an end of the circular coil 322 is grounded, and an end of the second serpentine coil 326 is connected to an RF power source 332. The connection of the circular coil 322 and the second serpentine coil 326 to the first serpentine coil 324, and the arrangement of the connection coils 328a and 328b therefor are the same as in the above-described embodiment. In addition, the cross-sectional shape of the coils 322, 324, and 326, the direction in which the coils 322, 324, and 326 are wound, the direction in which current flows through the coils 322, 324, and 326, and their effects are also the same as in the above-described embodiment.

Various examples of serpentine coil antennas, the distribution of a radial magnetic field component $B_r$ generated by each of the serpentine coil antennas, and the inductance of each of the serpentine coil antennas will be described with reference to FIGS. 12A through 12G and FIG. 13.

The images on the left side of FIGS. 12A through 12G show the structures of various serpentine coil antennas and the distribution of a radial magnetic field component $B_r$ generated by each of the antennas. The graphs on the right side of FIGS. 12A through 12G show the magnitude of radial magnetic field component as a function of distance from the center of each of the antennas. The data were obtained by a simulation of radial magnetic field distribution 5 cm below three arbitrary horizontal lines passing the center point of each of the antennas. For the simulation, the cross-sectional distribution of current through each coil of each of the antennas was assumed to be uniform.

Figure 1:
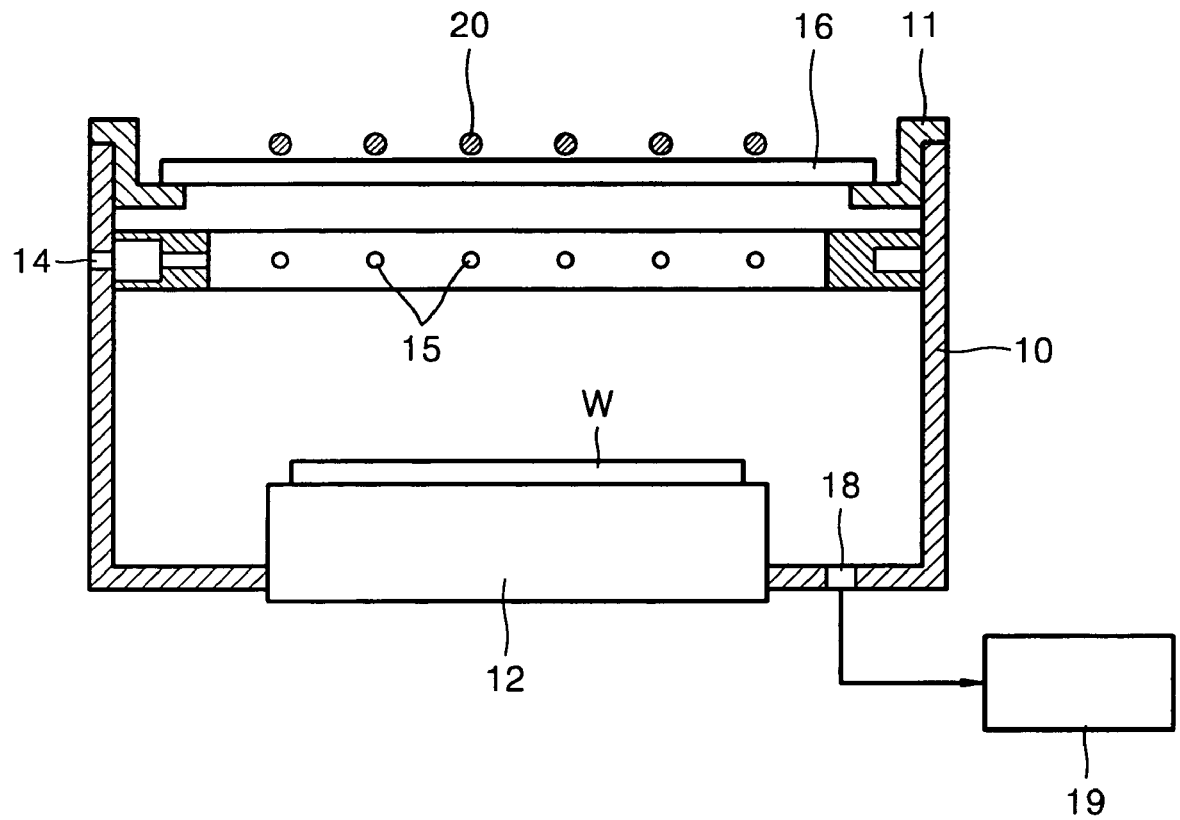
FIG. 1 shows the structure of a conventional inductively coupled plasma (ICP) generating apparatus.
Figure 2:
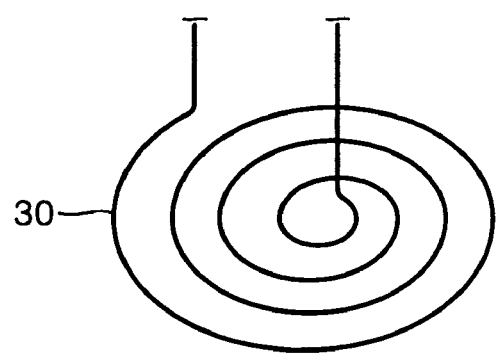
FIG. 2 shows an example of a conventional spiral coil antenna.
Figure 3A:
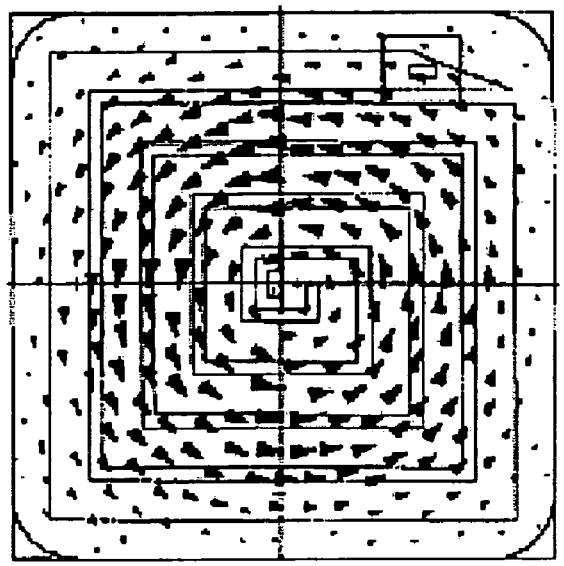
FIGS. 3A and 3B show distribution of electric field and density of plasma generated within the reaction chamber shown in FIG. 1 by the spiral coil antenna shown in FIG. 2, respectively.
Figure 3B:
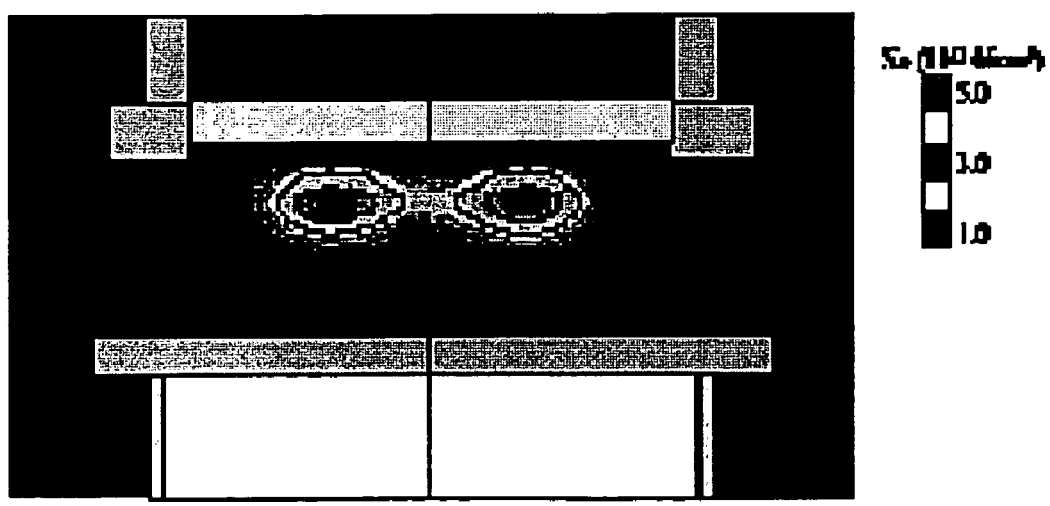
Figure 4A:
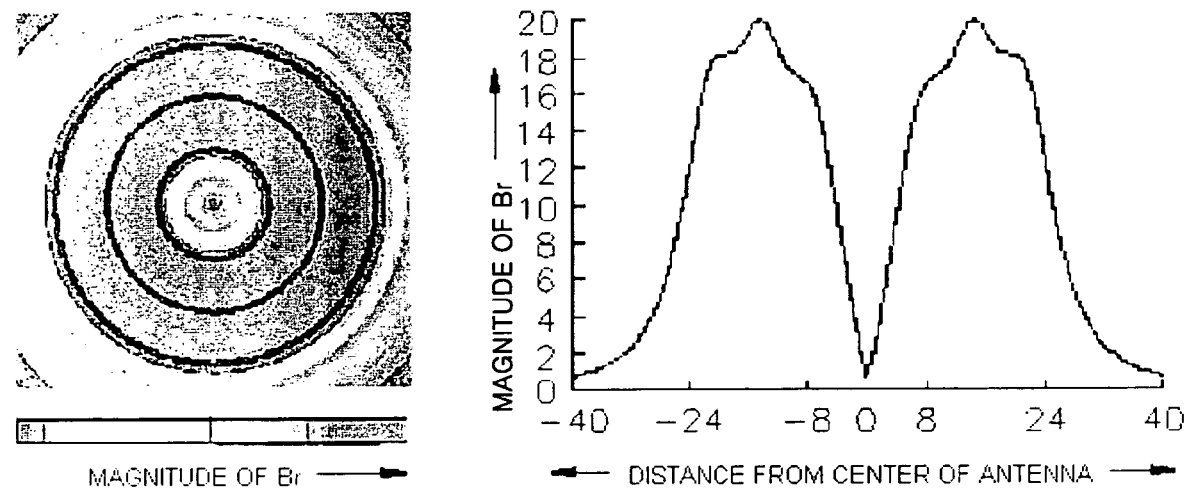
FIGS. 4A and 4B show distribution of radial direction components of magnetic fields produced by a conventional circular coil antenna.
Figure 4B:
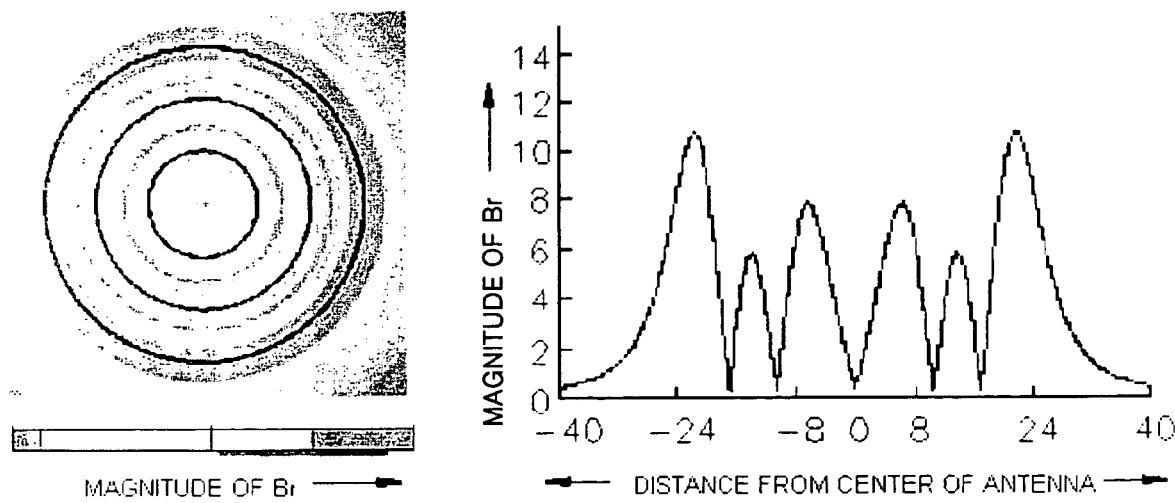
Figure 5A:
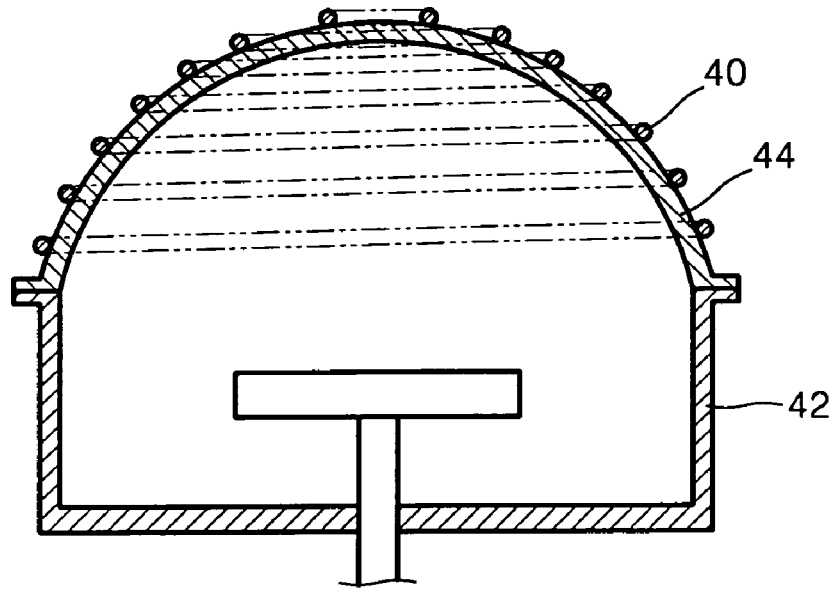
FIGS. 5A through 5D show various types of conventional coil antennas.
Figure 5B:
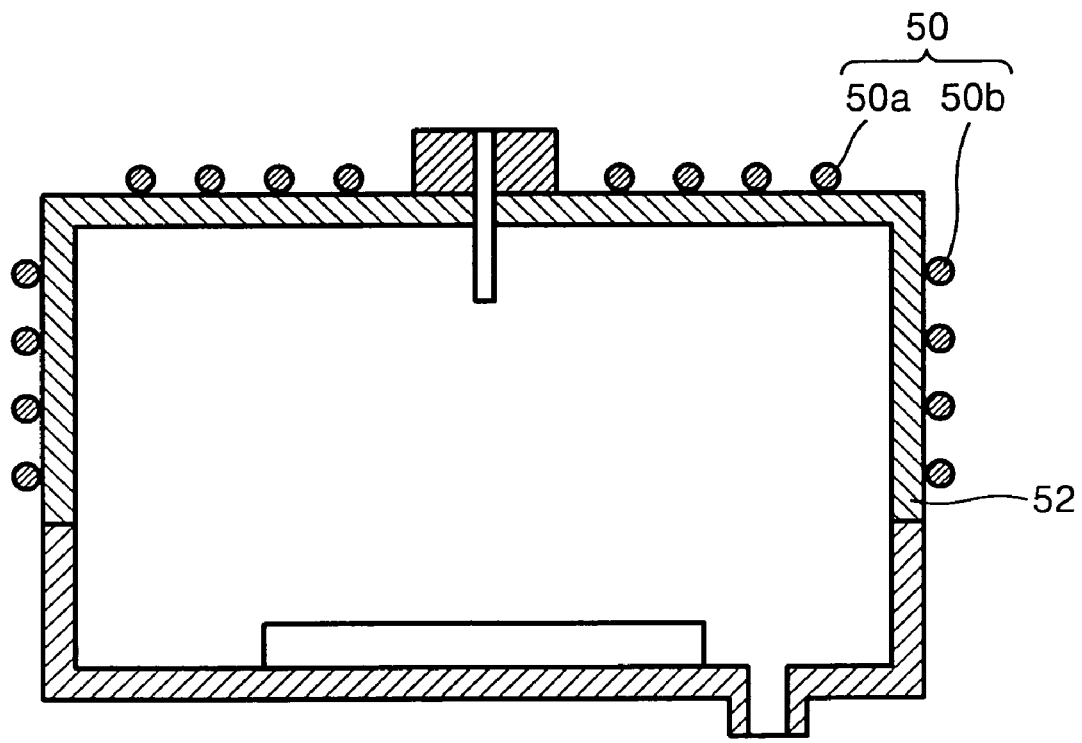
Figure 5C:
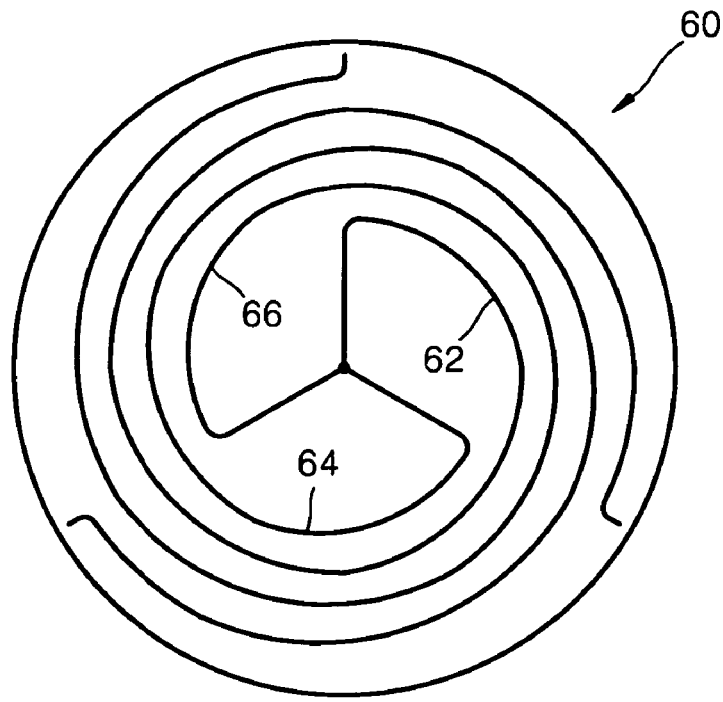
Figure 5D:
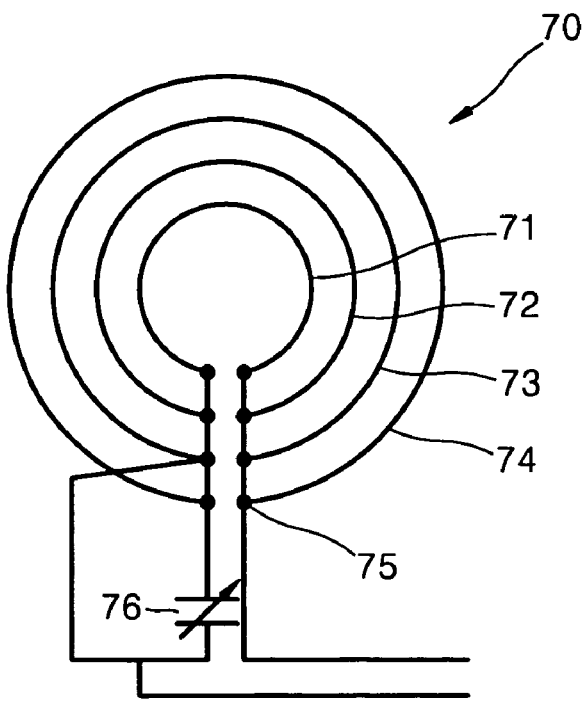

FIG. 13 is a graph of calculated inductance L for the circular coil antennas of FIGS. 4A and 4B and the serpentine coil antennas of FIGS. 12A through 12G.

The antenna of FIG. 12A includes a circular coil having a radius of 7 cm, which is placed at the center portion thereof, and two serpentine coils having an average radiuses of 14 cm and 21 cm, respectively, which are placed around the circular coil. The serpentine coil having an average radius of 14 cm has a zigzag pattern with equally spaced four sections with an outer radius that is 2 cm larger than its inner radius. The serpentine coil having an average radius of 21 cm has a zigzag pattern with equally spaced twelve sections with an outer radius that is 6 cm larger than its inner radius. Further, each coil has a 6 mm×6 mm square cross-section, and current flows through adjacent coils in opposite directions.

In the antenna of FIG. 12A, the central circular coil has a constant radius, and the outermost coil has a greater difference between its inner and outer diameters and more zigzags than the coil between the innermost circular and outermost coils. The inductance of the antenna having this structure is comparatively low, as shown in FIG. 13. Referring to the graph of FIG. 12A, which shows magnetic field distribution, advantageously the outermost peaks are wider and are shifted slightly outward compared to the antenna of FIG. 4B. However, since the height of the outermost peaks is reduced without change in the height of inner peaks, it is difficult to anticipate an improvement in plasma uniformity.

The antenna of FIG. 12B includes two circular coils having a radius of 7 cm and 16.1 cm, respectively, which are placed at first and third positions from the center of the antenna, and two serpentine coils having an average radius of 10.3 cm and 21 cm, respectively, which are placed at second and fourth positions from the center of the antenna. The serpentine coil having an average radius of 10.3 cm has a zigzag pattern with equally spaced eight sections with an outer radius that is 5.4 cm larger than its inner radius. The serpentine coil having an average radius of 21 cm has a zigzag pattern with equally spaced eight sections with an outer radius that is 8 cm larger than its inner radius. Further, each coil has a 6 mm×6 mm square cross-section, and current flows in opposite directions through adjacent coils.

In the antenna of FIG. 12B, despite the increased number of coils, the inductance of the antenna is still low, as shown in FIG. 13. Further, advantageously the outermost peaks, in the graph of magnetic field distribution of FIG. 12B, have a greater width, and the height of inner peaks is considerably reduced. Accordingly, it is anticipated that the plasma uniformity can be improved with the antenna having the structure of FIG. 12B.

The antenna of FIG. 12C includes a circular coil having a radius of 16.1 cm and a serpentine coil having an average radius of 21 cm, which is placed around the circular coil. The serpentine coil has a zigzag pattern with equally spaced eight sections with an outer diameter that is 8 cm larger than its inner radius. Further, each coil has a 6 mm×6 mm square cross-section, and current flows in opposite directions through the two coils.

The antenna of FIG. 12C has a simpler structure than the antenna of FIG. 12B but has the same structural advantages. The inductance of the antenna of FIG. 12C is considerably low, as shown in FIG. 13, and the magnetic field distribution has two separate peaks located away from the center of the coils. Accordingly, in the antenna shown in FIG. 12c, it is anticipated that plasma uniformity can be considerably improved.

The antenna of FIG. 12D includes a circular coil having a radius of 3 cm, which is placed at the center portion thereof, and a serpentine coil having an average radius of 14.3 cm, which is placed around the circular coil. The serpentine coil has a zigzag pattern with equally spaced eight sections with an outer diameter that is 22 cm larger than its inner radius. Further, each coil has a 6 mm×6 mm square cross-section, and current flows in opposite directions through the two coils.

The antenna of FIG. 12D has a similar structure to the antenna of FIG. 12C but the radius of its central circular coil is smaller than the radius of the circular coil of the antenna of FIG. 12C. For the antenna having the structure of FIG. 12D, the inductance is still lower than the simple conventional circular coil antennas of FIG. 4A, although it is slightly greater compared to the antenna of FIG. 12C. For the antenna of FIG. 12D, since the area of opposing portions of the circular coil and the serpentine coil is smaller than the antenna of FIG. 12C, the capacitance and capacitive coupling effects are expected to decrease. As is apparent from the magnetic field distribution in FIG. 12D, by optimizing the radius of the central circular coil, the difference between the inner and outer radiuses of the serpentine coil, and the number of zigzag patterns in the serpentine coil, the plasma uniformity can be improved to be greater than simple circular coil antennas and spiral coil antennas.

The antenna of FIG. 12E is a serpentine antenna having the structure described above with reference to FIGS. 6 and 7. The antenna of FIG. 12E has the same coil geometry as the antenna of FIG. 12D. Also, like the antenna of FIG. 12D, current flows in opposite directions through the two coils of the antenna of FIG. 12E. However, to investigate the effects of a rectangular coil cross-section, the antenna of FIG. 12E is designed to have a rectangular coil cross-section having a 1-mm width and a 36-mm height, unlike the antenna of FIG. 12D.

For the antenna having the structure of FIG. 12E, the inductance is considerably lower than the antenna of FIG. 12D, as shown in FIG. 13. The magnetic field distribution of the antenna of FIG. 12E is similar to the magnetic field distribution of the antennal of FIG. 12D, with the exception that the magnetic field strength increases toward the outer edge more smoothly compared to the antenna of FIG. 12D. Accordingly, in addition to the advantages of the antenna of FIG. 12D, since the antenna of FIG. 12E has a lower inductance, inductively coupled plasma discharge can be achieved at a high frequency.

The antenna of FIG. 12F is the same type as the antenna shown in FIG. 10. The antenna of FIG. 12F further includes an outermost circular moil in the basic coil geometry of the antenna of FIG. 12E. The outermost circular coil is spaced 1 cm apart from the inner serpentine coil. Each of the coils has a rectangular cross-section as described above, and current flows in opposite directions through adjacent coils.

For the antenna having the structure of FIG. 12F, the inductance is still low, as illustrated in FIG. 13. In addition, due to the outermost circular coil, peak magnetic fields generated by the inner circular coil and the serpentine coil are slightly shifted outwards compared to the antenna of FIG. 12E. Accordingly, the density of plasma near the edge portion of the antenna is increased.

The antenna of FIG. 12G is the same type as the antenna of FIG. 11 according to the third embodiment of the present invention. The antenna of FIG. 12G further includes an outermost serpentine coil in the basic coil geometry of the antenna of FIG. 12E. In other words, the outermost circular coil of the antenna of FIG. 12F is replaced with the serpentine coil. Each of the coils has a rectangular cross-section, as described above, and current flows in opposite directions through adjacent coils.

For the antenna having the structure of FIG. 12G, the inductance is still low, as shown in FIG. 13. Outermost magnetic field distribution in the radial and circumferential directions can be adjusted by adjusting the outermost serpentine coil. Accordingly, it is expected that plasma uniformity can be optimized by configuring the outermost serpentine coil in an appropriate pattern.

Regarding inductively coupled plasma discharge, when a high voltage is applied to an antenna, a high plasma potential is generated due to capacitive coupling, and plasma generation efficiency and plasma uniformity are deteriorated. Therefore, minimizing capacitive coupling effects should be considered when designing antennas. In the case of increasing frequencies to generate plasma with high density and low electron temperature and to improve inductive coupling efficiency for plasma discharge at lower pressure, a low-inductance antenna is required for efficient impedance matching. As described above, an antenna according to the present invention has a serpentine coil, which is long but occupies a small area. In the antenna according to the present invention, current flows in opposite directions through adjacent coils, and each of the coils has a cross-section having a larger height than width. Accordingly, the inductance of the antenna is considerably low. When using such a low inductance antenna, the impedance can be lowered sufficiently even when a high RF frequency is applied, and a potential difference across the antenna can be lowered, thereby reducing capacitive coupling effects. In addition, contamination by particles generated when ions collide against a dielectric window can be prevented. Furthermore, the smaller the radius of the central circular coil, the smaller the area of opposing portions of the central circular coil and an outer coil and the smaller the capacitance of the antenna. When the coils have smaller widths, the area of portions of the coils that face the dielectric window is reduced, and the effects of capacitive coupling with plasma are minimized.

Figure 14:
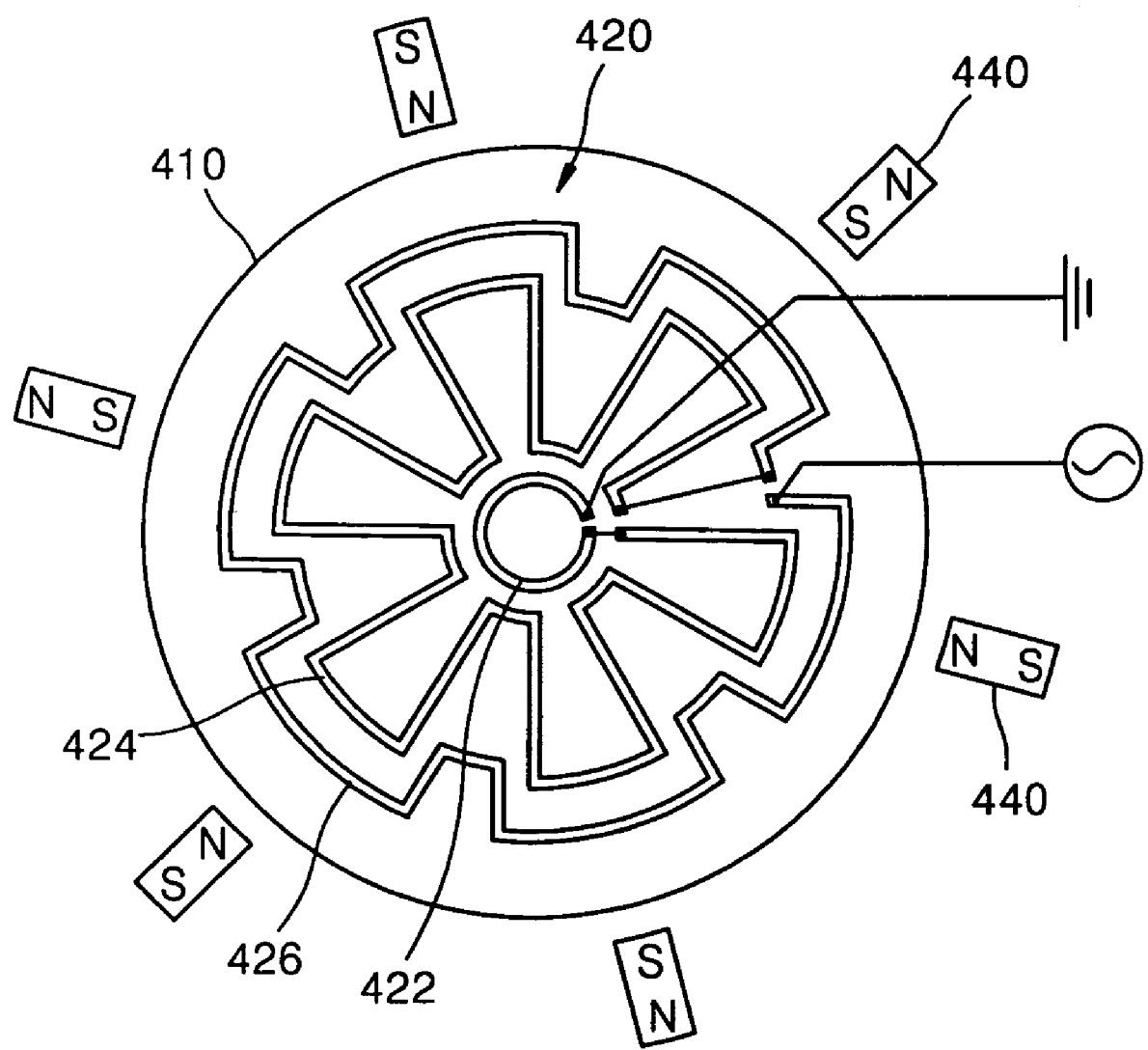
FIG. 14 is a plan view showing the arrangement of a serpentine coil antenna and permanent magnets in an ICP generating apparatus according to a fourth embodiment of the present invention.

FIG. 14 is a plan view showing the arrangement of a serpentine coil antenna and permanent magnets in an ICP generating apparatus according to a fourth embodiment of the present invention. Referring to FIG. 14, a serpentine coil antenna 420 is installed in an upper portion of a reaction chamber 410, and a plurality of permanent magnets 440 are arranged outside the reaction chamber 410. The plurality of permanent magnets 440 are arranged along the perimeter of the reaction chamber 410 such that their N pole and S pole alternate.

The serpentine coil antenna 420 includes a circular coil 422, which is positioned at the center portion thereof, and first and serpentine coils 424 and 426 arranged around the circular coil 422. The serpentine coil antenna 420 has the same structure as the serpentine coil antenna in FIG. 11 according to the third embodiment, and thus a detailed description thereon will not be repeated here. The serpentine coil antenna 420 may be replaced with the serpentine coil antenna according to the first or second embodiment described above.

It is preferable that the plurality of permanent magnets 440 are located at a region where the magnitude of the magnetic field generated by the antenna 420 is relatively weak. For the antenna 420, where the magnitude of the magnetic field is relatively weak at regions where outer portions of the first and second serpentine coils 424 and 426 are close to each other as shown in FIG. 12G, the permanent magnets 440 are arranged to correspond to the outer portions of the first and second serpentine coils 424 and 426.

When the structure of the antenna 440 is changed so that the magnetic field distribution is varied, it is preferable that the positions of the permanent magnets 440 are changed. To this end, it is preferable that the permanent magnets 440 are arranged such that they can revolve simultaneously around the reaction chamber 410 to shift their positions.

In the present embodiment, in order to offset the effects of local magnetic poles generated in the serpentine coil antenna 420, the plurality of permanent magnets 440 are arranged outside the reaction chamber 410. Such arranged permanent magnets 440 produce a so-called "multi-pole confinement effect", which refers to the confinement of plasma by magnetic fields of the permanent magnets 440. In other words, when the permanent magnets 440 are arranged along the perimeter of the reaction chamber 440 such that their N and S poles alternate, a magnetic mirror effect is induced near the inner wall of the reaction chamber 410, the wall loss of charged particles is reduced, the density of plasma near the inner wall of the reaction chamber 410 is increased, and uniformity of plasma density is improved. Magnetic fields generated by the permanent magnets 440 concentrate near the wall of the reaction chamber 410, so that most of plasma generated in the reaction chamber 410 is not affected by the magnetic fields generated by the permanent magnets 440. For the serpentine coil antenna 420 whose magnetic field is relatively weak at outer portions, the multi-pole confinement effect becomes more efficient when the permanent magnets 440 are located at the outer portions having the relatively weak magnetic field.

As described above, according to the embodiment illustrated in FIG. 14, due to the drop in wall loss of electrons by the multi-pole confinement effect, the plasma density and plasma uniformity in the reaction chamber can be increased. In addition, when the positions of permanent magnets arranged around the antenna can be conveniently varied, the properties of plasma can be optimized for different processing conditions.

Figure 15:
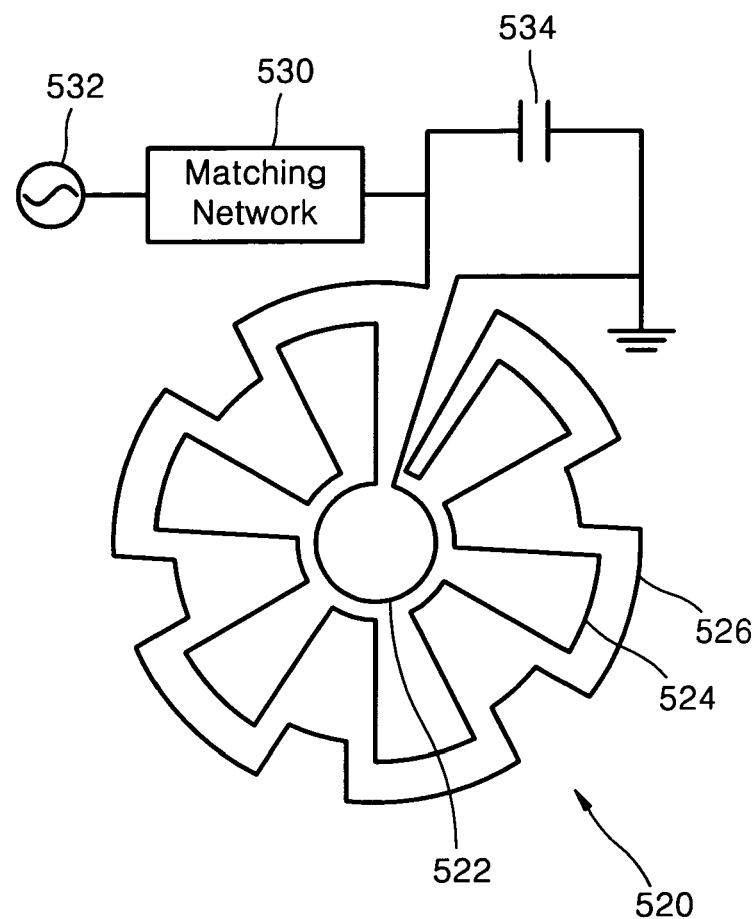
FIG. 15 is a plan view showing the arrangement of a serpentine coil antenna, a matching network, and a capacitor connected in parallel thereto to induce LC resonance in an ICP generating apparatus according to a fifth embodiment of the present invention.

FIG. 15 is a plan view showing the arrangement of a serpentine coil antenna, a matching network, and a capacitor in a ICP generating apparatus according to a fifth embodiment of the present invention. Referring to FIG. 15, a matching network 530 is connected between an RF power source 532 and a serpentine coil antenna 520, and a capacitor 534 is connected between the serpentine coil antenna 520 and the matching network 530, in parallel with the serpentine coil antenna 520.

The serpentine coil antenna 520 includes a circular coil 522, which is positioned at the center portion thereof, and first and second serpentine coils 524 and 526, which are arranged around the circular coil 522. The serpentine coil antenna 520 has the same structure as the serpentine coil antenna in FIG. 11 according to the third embodiment of the present invention, and thus a detailed description thereon will not be repeated here. The serpentine coil antenna 520 may be replaced with the serpentine coil antenna according to the first or second embodiment described above. Alternatively, the serpentine coil antenna 520 may be replaced with a conventional circular coil antenna or spiral coil antenna. In other words, the ICP apparatus according to the fifth embodiment of the present invention is compatible with any types of antennas.

The circular coil 522 and the first and second serpentine coils 524 and 526, which constitute the serpentine coil antenna 520, may be connected to the RF power source 532 in series. Although not illustrated, some or all of the coils 522, 524, and 526 may be connected in parallel to the RF power source 532. In other words, the capacitor 534 is always connected in parallel to the RF power source 532, whereas the coils 522, 524, and 526, which constitute the serpentine coil antenna 520, may be connected to the RF power source 532 in series or in parallel. The inductance of the antenna 520 can be appropriately adjusted, if necessary, by connecting the coils 522, 523, and 526 to the RF power source 532 in series or in parallel.

In the embodiment illustrated in FIG. 15, since the capacitor 534 is connected in parallel between the serpentine coil antenna 520 and the matching network 530, an LC resonance phenomenon can be utilize to make initial plasma discharge easier and to ensure stable processing with inductively coupled plasma.

As described above, regarding ICP discharge, initial plasma discharge is induced through capacitive coupling when a high antenna voltage is applied, and then inductively coupled discharge is accomplished by an electric field induced by an AC current flowing through the antenna coil. A threshold breakdown voltage required for the initial capacitive coupling depends on the processing pressure or processing gas. For an antenna with adjacent coils wound in opposite directions and having low inductance, very high RF power should be applied to cause a larger potential difference in the antenna. Otherwise, initial plasma discharge through capacitive coupling, which requires a large potential difference, cannot be induced. However, when utilizing a LC resonance phenomenon that can be induced by appropriately pre-setting the matching network, a large potential difference enabling initial discharging through capacitive coupling can be induced with such a low-inductance antenna. This will now be described with reference to FIG. 16 and FIGS. 17A through 17D.

Figure 16:
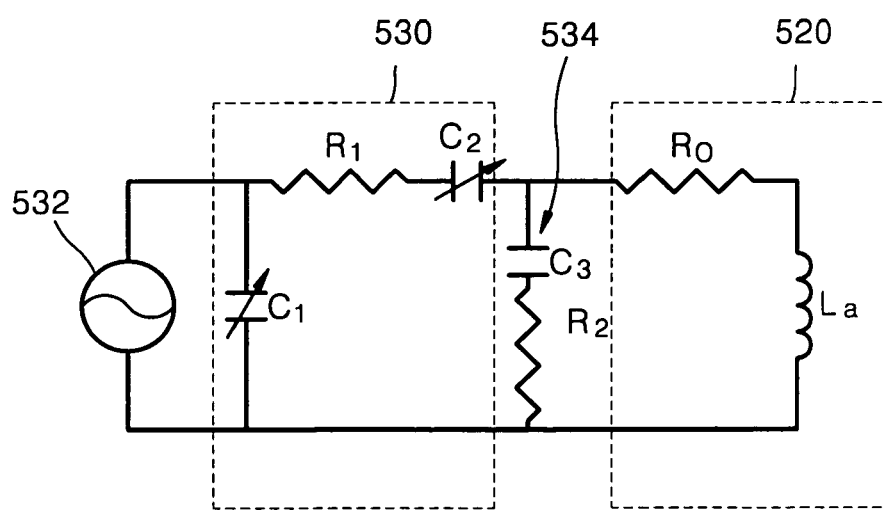
FIG. 16 is a circuit diagram of an L-type matching network connected to an antenna.

FIG. 16 is a circuit diagram of an L-type matching network connected to an ICP antenna, and FIGS. 17A through 17D are graphs for explaining the LC resonance phenomenon when the reactance of the capacitor of FIG. 15 is varied.

Referring to FIG. 16, a matching network 530, which connects an RF power source 532 and an antenna 520, includes two variable capacitors $C_1$ and $C_2$. Further, a capacitor $C_3$, which corresponds to the capacitor 534 in FIG. 15, is connected in parallel between the matching network 530 and the antenna 520. Resistance $R_1$ is incorporated into the equivalent circuit of FIG. 16 in consideration of ohmic loss in the matching network 530.

Figure 17A:
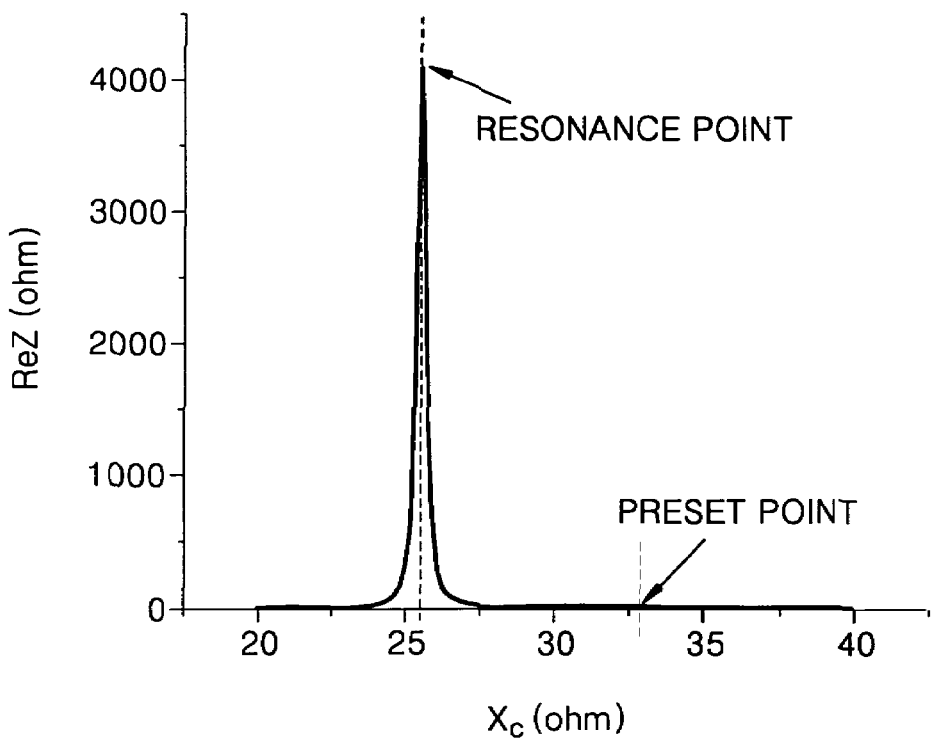
FIGS. 17A through 17D are graphs for explaining the LC resonance phenomenon when the reactance of a capacitor in FIG. 15 is varied.
Figure 17B:
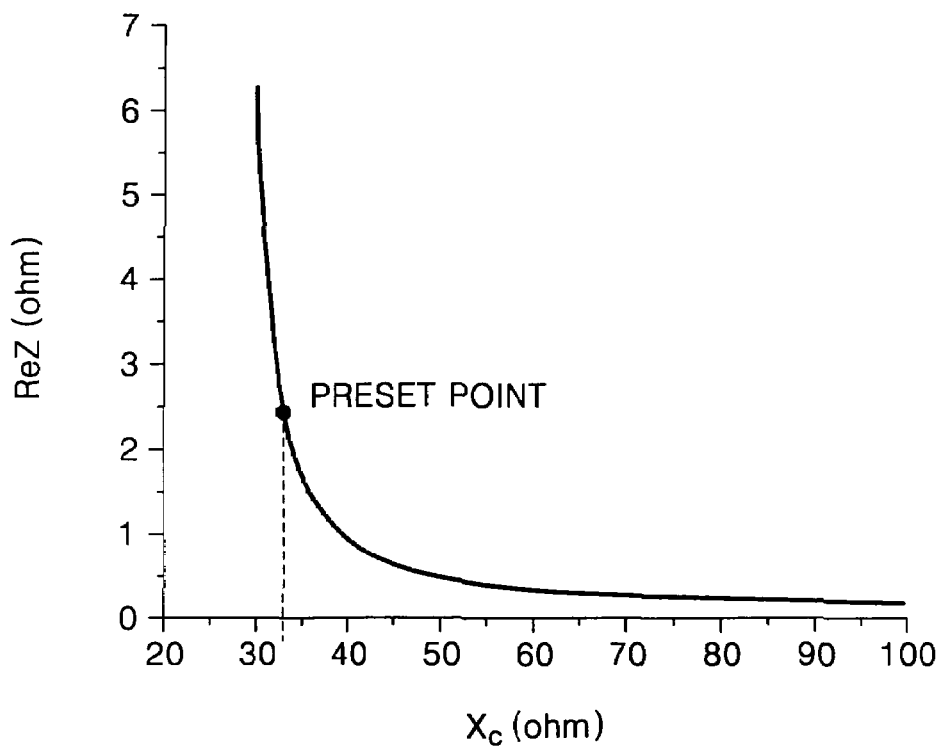

FIG. 17A is a graph of impedance versus reactance for explaining resonance phenomena, FIG. 17B is a scale-up graph for a preset point in FIG. 17A. In FIGS. 17A and 17B, ReZ denotes the real part of antenna impedance Z.

As illustrated in FIGS. 17A and 17B, the input impedance Z of the antenna is varied by the capacitor $C_3$ connected in parallel to the antenna. For example, when the RF frequency is 13.56 MHz and the antenna 520 has an impedance $L_a$ of 300 nH and a resistance $R_0$ of 0.1 ohms, LC resonance occurs at a capacitor ($C_3$) reactance Xc of 25.65 ohms (i.e., C=458 pF). Since a Q-factor of the ICP antenna is larger before plasma generation than after, a narrow resonance peak appears. The impedance Z of the antenna greatly increases at the resonance point for a given RF power, so that the antenna has too great a voltage difference to match the RF power. Unless matching conditions are satisfied, significant RF power reflection occurs, disabling efficient plasma discharging.

To solve these problems, a preset point of the matching network is set to slightly deviate from the resonance point. For example, as shown in FIGS. 17A and 17B, the preset point is set at a point where the capacitor $C_3$ has a capacitance of 355 pF and a reactance Xc of 33 ohms. In these conditions, the reactance Xc is large enough for matching, and the antenna connected to the matching network has inductor-like electrical properties. Thus, matching conditions can be satisfied with the L-type matching network consisting of only two variable capacitors $C_1$ and $C_2$. When resistors $R_1$ and $R_2$ in FIG. 16 have a resistance of 0.05 ohms and a 3-m long, 50-ohm cable is used, the capacitances of the capacitors $C_1$ and $C_2$ for matching are 1,000 pF and 115 pF, respectively. These capacitances fall within a range that can be easily achieved in most matching networks.

Figure 17C:
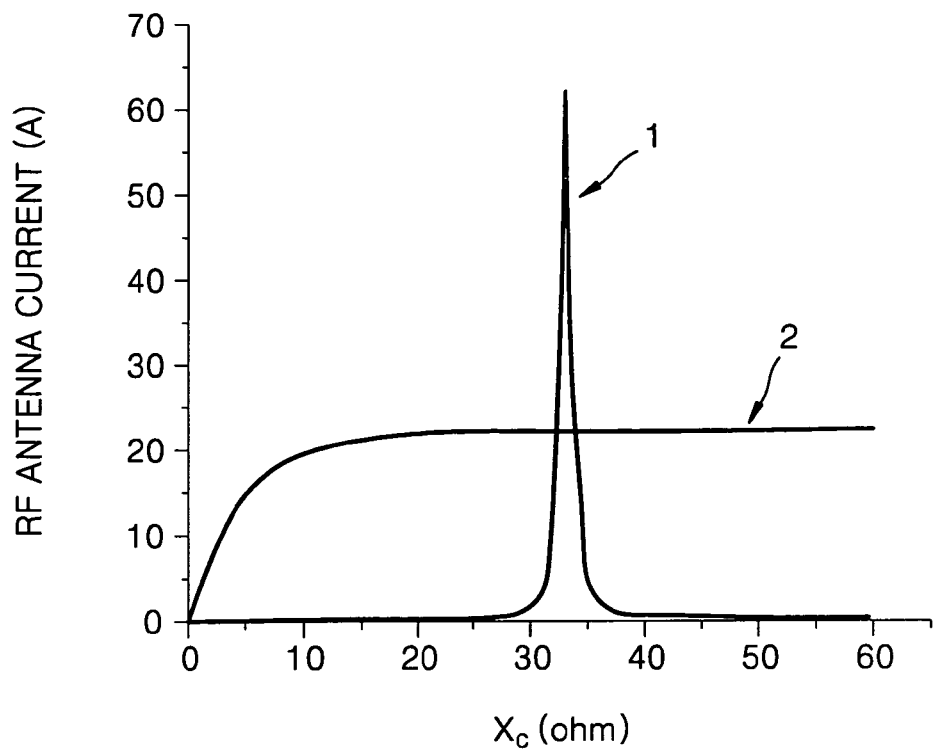
Figure 17D:
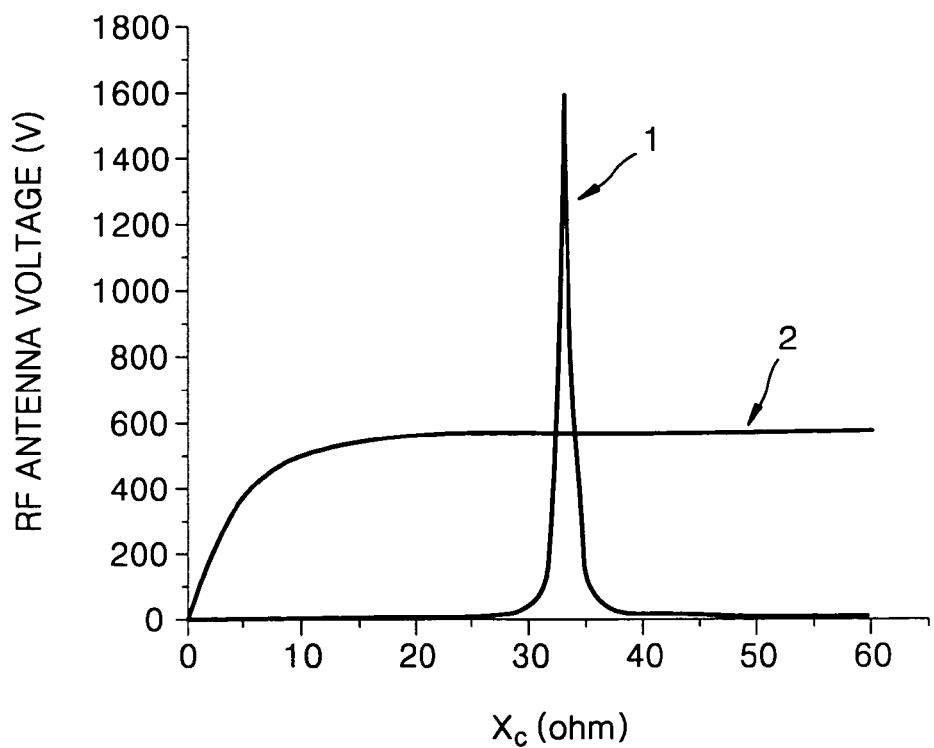

When the preset point of the matching network is set, prior to plasma discharging, to satisfy the above calculated results, and an input RF power is 500 watts, the current and voltage across the ICP antenna show resonance characteristics as shown in FIGS. 17C and 17D with respect to variation of reactance Xc of the capacitor $C_3$. That is, when the capacitor $C_3$ has a capacitance of 355 Pf, at which resonance can be induced, the antenna voltage increases to about 1,600 volts, which is high enough to cause initial plasma discharge. After plasma generation, the antenna resistance increases, and the antenna voltage and current drop. For example, when the resistance of a resistor $R_0$ of the antenna in FIG. 16 is increased from 0.1 ohms before plasma generation to 1.0 ohm after plasma generation, the electrical characteristics of the antenna are changed as indicated by curve 2 in FIGS. 17C and 17D. Curve 1 in FIGS. 17C and 17D indicates a resonance phenomenon before plasma generation. After plasma generation, the matching network is automatically set to satisfy the matching conditions. As a result of the change in electrical characteristics, i.e., from curve 1 to curve 2, a large amount of current flows through the antenna, so that inductive coupling discharge is accelerated following capacitive coupling discharge and plasma characteristics can be maintained stably.

The capacitances of the two capacitors $C_1$ and $C_2$, which satisfy the above resonance conditions, may vary for experimental resonance conditions. However, it is not necessary to accurately set the preset point of the matching network at the beginning in order to find resonance conditions. To find accurate resonance conditions before plasma discharge, the preset point of the matching network is approximated after the pressure of a chamber is reduced to an order of mTorr not to cause plasma discharge, and a RF power is applied to the matching network in an automatic mode.

As described above, utilizing the LC resonance phenomenon between the antenna and the capacitor makes initial plasma discharge easier and maintains plasma density stably high. This also can be applied when a Faraday shield is installed between the antenna and a dielectric window. In addition, as described above, the inductance of the antenna can be adjusted for optimal plasma discharge if required, by connecting the coils constituting a serpentine coil antenna according to the present invention either in parallel or in serial.

As described above, an ICP generating apparatus according to the present invention provides the following effects.

First, uniformity of plasma density distribution can be improved by controlling magnetic field distribution in a reaction chamber by optimizing the difference between the outer and inner radiuses and the number of zigzag patterns in a serpentine coil antenna. In addition, by adjusting the cross-sectional shapes of the coils and the direction in which current flows through the coils, the inductance of the antenna can be efficiently reduced if necessary. Accordingly, efficient plasma discharge using high frequencies can be accomplished, and capacitive coupling effects can be minimized.

Second, the uniformity of plasma density and the plasma density can be further improved by arranging a plurality of permanent magnets outside the reaction chamber for the multi-pole confinement effect. The properties of plasma can be optimized by varying the positions of the permanent magnets depending on the structure of the used serpentine coil antenna.

Third, a LC resonance phenomenon can be induced by connecting a capacitor in parallel between the antenna and a L-type matching network, so that initial plasma discharge becomes easier, and processing using inductively coupled plasma is stabilized.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. An inductively coupled plasma (ICP) generating apparatus comprising:
    an evacuated reaction chamber;
    an antenna installed at an upper portion of the reaction chamber to induce an electric field for ionizing reaction gas supplied into the reaction chamber and generating plasma; and
    a radio frequency (RF) power source connected to the antenna to apply radio frequency power to the antenna, wherein the antenna comprises a plurality of coils comprising an open ended first continuous serpentine coil, an open ended second continuous circular coil, and an open ended third continuous serpentine coil surrounding the first continuous serpentine coil, wherein the first and third serpentine coils are bent in a zigzag pattern, and wherein the first and third serpentine coils comprise an outer loop, an inner loop, and connecting portions between the outer loop and the inner loop, wherein the outer loop of the first serpentine coil and the outer loop of the third serpentine coil are approximately parallel, the inner loop of the first serpentine coil and the inner loop of the third serpentine coils are approximately parallel, the connecting portions of the first serpentine coil are approximately parallel to the connecting portions of the third serpentine coil and are longer than the connecting portions of the third serpentine coil, and the first serpentine coil does not overlap or cross the any portion of the third serpentine coil.

2. The inductively coupled plasma generating apparatus of claim 1, wherein the circular coil is arranged at a center portion of the antenna and the first serpentine coil is arranged around and connected to the circular coil, and wherein the third serpentine coil is shaped to nest around and outline the first serpentine coil.

3. The inductively coupled plasma generating apparatus of claim 2, wherein the circular coil has a relatively small radius to reduce the area of opposing portions between the circular coil and the serpentine coil.

4. The inductively coupled plasma generating apparatus of claim 1, wherein the first and third serpentine coils have a zigzag pattern with equally spaced outer loop and inner loop sections, and wherein the first and third serpentine coils have an equal number of equally spaced outer loop and inner loop sections.

5. The inductively coupled plasma generating apparatus of claim 4, wherein the first and third serpentine coils have a plurality of outer portions extending along the circumference and a plurality of inner portions bent toward the center portion.

6. The inductively coupled plasma generating apparatus of claim 5, wherein the inner and outer loops of the first and third serpentine coils are arranged to correspond to center and edge portions of the reaction chamber, respectively.

7. The inductively coupled plasma generating apparatus of claim 1, wherein the plurality of coils further comprise at least one connection coil, wherein the connection coil connects the first serpentine coil and the circular coil of the plurality of coils.

8. The inductively coupled plasma generating apparatus of claim 1, wherein the first serpentine coil's zigzag pattern has a rectangular cross-section having a width smaller than height.

9. The inductively coupled plasma generating apparatus of claim 1, wherein the circular coil has a continuous circular cross-section.

10. The inductively coupled plasma generating apparatus of claim 1, further comprising a plurality of permanent magnets arranged around the outer wall of the reaction chamber.

11. The inductively coupled plasma generating apparatus of claim 10, wherein the plurality of permanent magnets are arranged around the outer wall of the reaction chamber such that their N and S poles alternate.

12. The inductively coupled plasma generating apparatus of claim 10, wherein the plurality of permanent magnets are arranged at a region where the magnitude of a magnetic field generated by the antenna is relatively weak.

13. The inductively coupled plasma generating apparatus of claim 10, wherein the plurality of permanent magnets are arranged such that they can revolve simultaneously about a central axis of the reaction chamber to shift their positions according to the distribution of the magnetic field generated by the antenna.

14. The inductively coupled plasma generating apparatus of claim 1, further comprising:
    a matching network connected between the radio frequency power source and the antenna; and
    a capacitor connected between the matching network and the antenna, in parallel with the antenna.

15. The inductively coupled plasma generating apparatus of claim 14, wherein the plurality of coils of the antenna are connected in series to the radio frequency power source.

16. The inductively coupled plasma generating apparatus of claim 14, wherein at least one of the coils of the antenna is connected in parallel to the radio frequency power source.

17. The inductively coupled plasma generating apparatus of claim 1, wherein the first and third serpentine coils and the circular coil are three separate coils, and further comprising a first connection coil that communicatively connects the first serpentine coil to the circular coil and a second connection coil that communicatively connects the first serpentine coil to the third serpentine coil.

18. The inductively coupled plasma generating apparatus of claim 1, wherein the inner and outer loops of the third serpentine coil, the inner and outer loops of the first serpentine coil and the circular coil are concentric.

19. The inductively coupled plasma generating apparatus of claim 1, wherein the first continuous serpentine coil is connected to the RF power source at the end away from the second circular coil, and wherein the second circular coil is connected to ground at the end away from the first continuous serpentine coil.

20. An inductively coupled plasma (ICP) generating apparatus comprising:
an evacuated reaction chamber;
an antenna installed at an upper portion of the reaction chamber to induce an electric field for ionizing reaction gas supplied into the reaction chamber and generating plasma; and
a radio frequency (RF) power source connected to the antenna to apply radio frequency power to the antenna,
wherein the antenna comprises a coil comprising an open ended serpentine continuous first portion, a separate open ended circular continuous second portion connected end to end from one end of the single serpentine first portion to one end of the single circular second portion, and an open ended serpentine continuous third portion surrounding, but not overlapping the serpentine continuous first portion.

21. The inductively coupled plasma generating apparatus of claim 20, wherein the circular continuous second portion is arranged at a center portion of the antenna, the serpentine continuous first portion is arranged around and connected to the circular continuous second portion, and the serpentine continuous third portion is arranged around and connected to the serpentine continuous first portion.

22. The inductively coupled plasma generating apparatus of claim 20, wherein the serpentine continuous first portion is connected to the RF power source at an end region away from the circular continuous second portion, and wherein the circular continuous second portion is connected to ground at an end region away from the serpentine continuous first portion.

23. The inductively coupled plasma generating apparatus of claim 20, wherein the apparatus further comprises a connection coil that communicatively connects the serpentine continuous first portion to the serpentine continuous second portion.

24. An inductively coupled plasma (ICP) generating apparatus comprising:
an evacuated reaction chamber;
an antenna installed at an upper portion of the reaction chamber to induce an electric field for ionizing reaction gas supplied into the reaction chamber and generating plasma; and
a radio frequency (RF) power source connected to the antenna to apply radio frequency power to the antenna,
wherein the antenna comprises three coils:
a first center, circular coil and communicatively connecting the first coil to the second coil;
a second serpentine shaped coil surrounding the first coil; and
a third coil;
wherein the second serpentine shaped coil has first inner portions shaped to nest in a complementary manner to the shape of the outer surface of the first coil, wherein the second serpentine shaped coil has first outer portions shaped to nest in a complementary manner to the shape of the outer surface of the third coil, and wherein the second serpentine shaped coil has connecting portions connecting the first inner portions and the first outer portions and the connecting portions are aligned in approximately radial directions, wherein the third coil has second inner portions complementary to the inner surface of the second coil, second outer portions complementary to the outer surface of the second coil and connecting portions connecting the second inner portions and the second outer portions, and wherein the first, second and third coils do not overlap one another.

* * * * *